United States Patent
Rivkin

(10) Patent No.: US 11,568,889 B2
(45) Date of Patent: Jan. 31, 2023

(54) MAGNETIC PROCESSING UNIT

(71) Applicant: RKMAG CORPORATION, Middletown, DE (US)

(72) Inventor: Kirill Rivkin, Middletown, DE (US)

(73) Assignee: RKMAG CORPORATION, Middletown, DE (US)

( * ) Notice: Subject to any disclaimer, the term of this patent is extended or adjusted under 35 U.S.C. 154(b) by 0 days.

(21) Appl. No.: 17/628,843

(22) PCT Filed: Jul. 21, 2020

(86) PCT No.: PCT/US2020/042908
§ 371 (c)(1),
(2) Date: Jan. 20, 2022

(87) PCT Pub. No.: WO2021/016257
PCT Pub. Date: Jan. 28, 2021

(65) Prior Publication Data
US 2022/0270639 A1 Aug. 25, 2022

Related U.S. Application Data

(60) Provisional application No. 62/876,997, filed on Jul. 22, 2019.

(51) Int. Cl.
| | |
|---|---|
| *G06F 17/16* | (2006.01) |
| *G06N 3/063* | (2006.01) |
| *G11C 11/54* | (2006.01) |
| *G11B 5/09* | (2006.01) |
| *G11B 5/31* | (2006.01) |

(52) U.S. Cl.
CPC ........... *G11B 5/09* (2013.01); *G06F 17/16* (2013.01); *G06N 3/063* (2013.01); *G11B 5/3146* (2013.01); *G11C 11/54* (2013.01)

(58) Field of Classification Search
CPC .............................. G06F 17/16; G11C 11/54
USPC .................................................. 365/158
See application file for complete search history.

(56) References Cited

U.S. PATENT DOCUMENTS

| | | | | |
|---|---|---|---|---|
| 10,483,830 | B2* | 11/2019 | Guo | H01L 27/22 |
| 2002/0056679 | A1* | 5/2002 | Sato | B03C 1/288 |
| | | | | 210/222 |
| 2004/0095126 | A1 | 5/2004 | Kudo et al. | |
| 2007/0223125 | A1 | 9/2007 | Ohtsu | |
| 2015/0333741 | A1 | 11/2015 | Lee | |
| 2016/0134989 | A1 | 5/2016 | Herre et al. | |
| 2018/0198232 | A1* | 7/2018 | Troufflard | H01R 13/6205 |

OTHER PUBLICATIONS

International Search Report and Written Opinion of the International Searching Authority for International Patent Application No. PCT/US2020/042908 dated Sep. 28, 2020, 5 pages.

Meng, H. et al., "A Spintronics Full Adder for Magnetic CPU", IEEE Electron Device Letters, 26(6): 360-362 (Jun. 2005).

* cited by examiner

*Primary Examiner* — Anthan Tran
(74) *Attorney, Agent, or Firm* — Merchant & Gould P.C.

(57) ABSTRACT

A magnetic processing unit ("MPU") includes a magnetic element with one or more input channels and one or more output channels. The magnetic element can acquire magnetic arrangement configured to perform a predetermined operation on the received input signal and provide a resulting output signal.

28 Claims, 33 Drawing Sheets

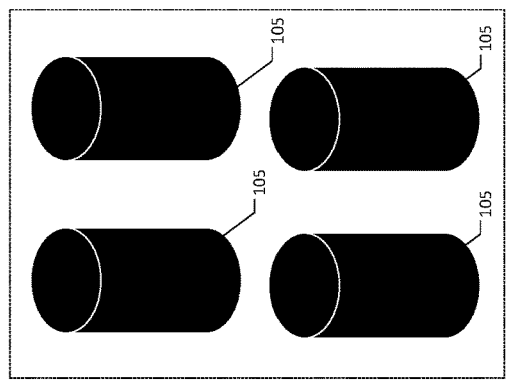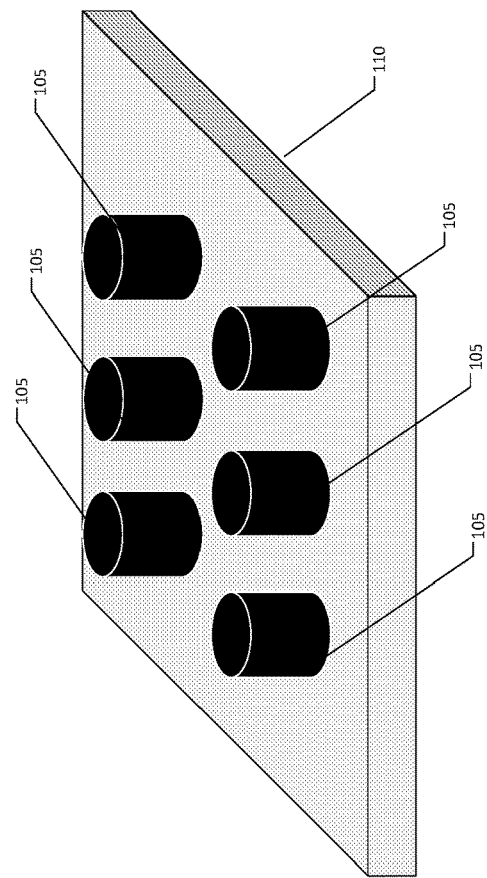

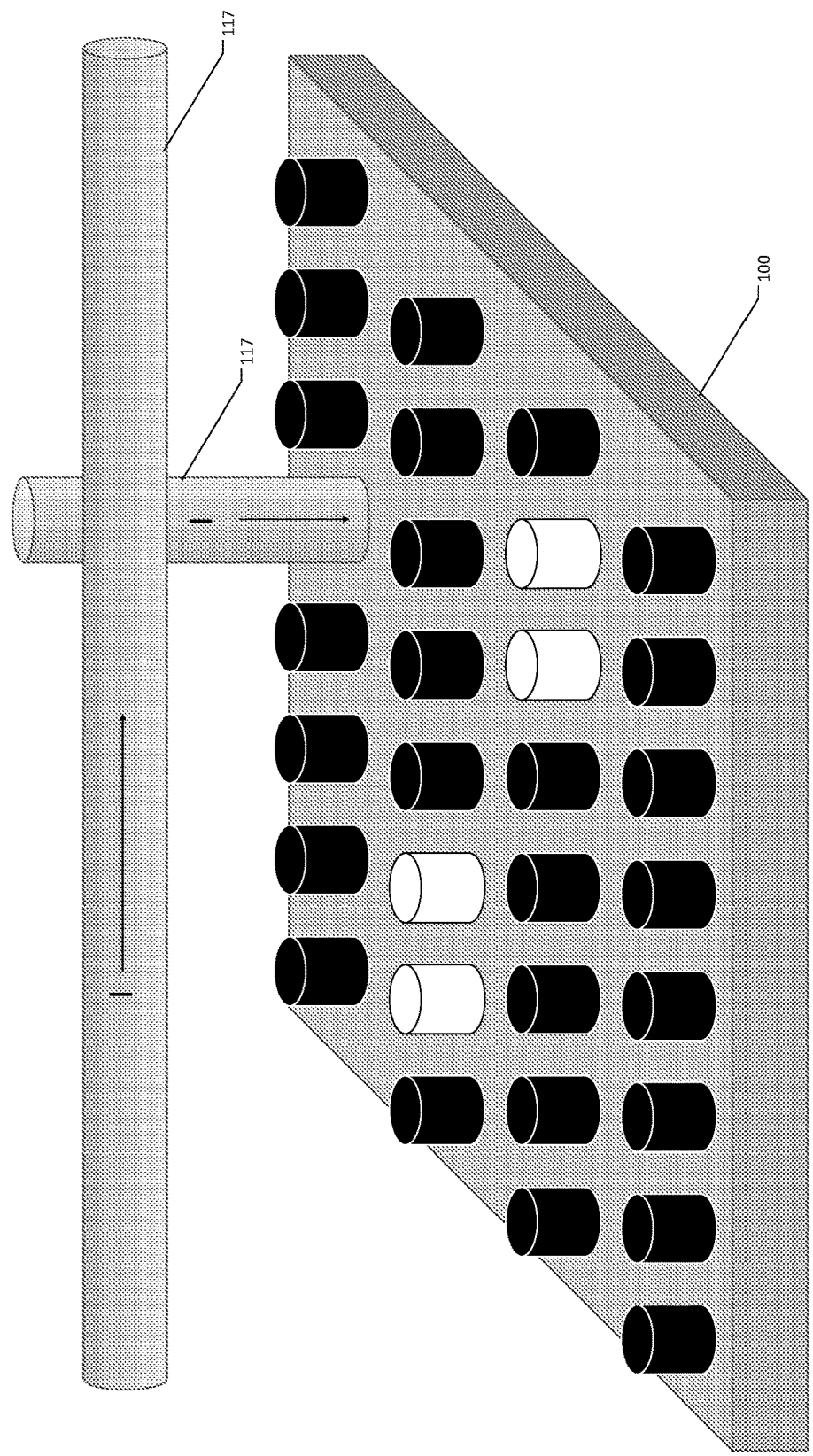

$$\begin{pmatrix} A_1 \\ \vdots \\ A_m \end{pmatrix} = \begin{pmatrix} w_{11} & \cdots & w_{1n} \\ \vdots & \vdots & \vdots \\ w_{m1} & \cdots & w_{mn} \end{pmatrix} \begin{pmatrix} I_1 \\ \vdots \\ I_n \end{pmatrix} = \begin{pmatrix} w_{11} & \cdots & w_{1n} \\ \vdots & \vdots & \vdots \\ w_{m1} & \cdots & w_{mn} \end{pmatrix} \begin{pmatrix} q_1 & 0 & 0 \\ 0 & \cdots & 0 \\ 0 & 0 & q_n \end{pmatrix} \begin{pmatrix} I_0 \\ I_0 \\ I_0 \end{pmatrix}$$

Figure 23.

MAGNETIC PROCESSING UNIT

CROSS-REFERENCE TO RELATED APPLICATION

This application is a National Stage Application of PCT/US2020/042908, filed on Jul. 21, 2020, which claims priority to and the benefit of U.S. Provisional Patent Application No. 62/876,997, filed on Jul. 22, 2019, the entire contents of which are incorporated by reference. To the extent appropriate, a claim of priority is made to each of the above disclosed applications.

BACKGROUND

In optical computing, some operations are performed by interference between optical waves. The set of available operations includes, for example, simple summation, vector by matrix multiplication, Fourier transformation as well as a combination of both linear vector by matrix multiplication and non-linear transmittance of waves, a combination which can be potentially employed as part of a Neural Network.

Yet optical computing suffers from a number of intrinsic issues. There is a relatively large size of a typical operational wavelength (500-1100 nm), limiting the size of any optical system utilizing it. Further, the optical properties (for example, refraction index) of materials can be adjusted, for example by applying external electrical or magnetic field, but only within a very narrow range of values. As a result, optical computing systems are suitable for applications for which size is not a limiting factor, and minimal to no adjustment of operational parameters is required, except for what can be accomplished by changing the amplitudes of the optical beams.

As a viable alternative, numerous devices were proposed that can perform such basic functions as summation, and/or logical operations (AND, OR, XOR) on the input signals which exist in a form of collective magnetic oscillations (spin waves). However, so far none of these proposals provided an efficient method by which the parameters related to such operations can be adjusted. For example, while summation of two signals is possible, the existing proposals do not identify an apparatus that could perform the weighted summation of such signals with adjustable weights' values. Also the existing proposals offer very limited functionality when it comes to extending the set of available operations to more complex variants, for example, going from summation to a more general and complex matrix-vector multiplication.

There have been proposals for systems which include two or more spin transfer torque oscillators ("STO"), whose mutual resonant coupling enables the system to switch between linear and saturated regimes of operation, i.e. adjust the nature of dependence between the input and output signals. However, in such devices the operational parameters associated with these regimes are difficult to adjust without physically replacing the STOs, and only an extremely limited set of operations can be performed. For example, while there are numerous proposals regarding using such devices as part of Neural Network, they do not include the apparatus to perform weighted summation over the input signals. When such is required, the signals are typically converted from magnetic oscillations to electric currents and then summed by a separate electrical circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-4D illustrate an example of a magnetic element including a patterned array of magnetic "dots."

FIGS. 6-11 illustrate examples of a magnetic programmer configured to selectively alter the magnetization in the magnetic element.

FIGS. 12-24 illustrate various examples of aspects of the input and output channels and signals and operations thereon.

DETAILED DESCRIPTION

Figure 1:
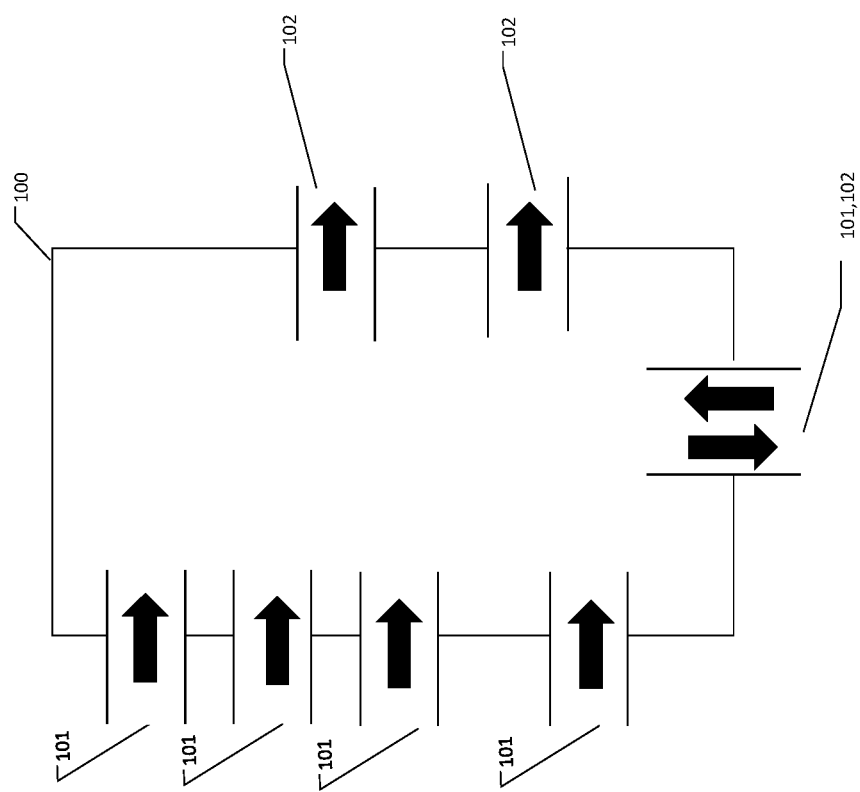
FIG. 1 illustrates an example of a Magnetic Processing Unit ("MPU") in accordance with aspects of the present disclosure.

In the following disclosure, reference is made to the accompanying drawings, which form a part hereof, and in which is shown by way of illustration specific embodiments in which the invention may be practiced. In this regard, directional terminology, such as top, bottom, front, back, etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense In the following disclosure, in instances when referring to either channels or channel, signals or signal, and the like both plural and singular counts are assumed, i.e. channels can mean one or multiple channels, and signal can mean one or multiple signals. Similarly, all referencing to a magnetic material can constitute a single magnetic material, as well as some combination of multiple magnetic materials with different properties.

In the following disclosure, collective magnetic oscillations in a magnetic material are considered synonymous with the term "spin waves".

In the following disclosure, by "environmental variables" we denote any combination of temperature, applied external magnetic field, spin torque and/or other parameters related to physical phenomena which affect the magnetic properties of magnetic materials.

When referring to exchange interaction within the context of the current disclosure, the term is understood in its most general sense and can refer to a variety of short range interactions such as, but not limited to ferromagnetic and anti-ferromagnetic exchange interactions, Dzjalushinsky-Moria interaction, RKKY coupling or other forms of short range interaction or their combined effect.

This disclosure provides an apparatus, referred to as a Magnetic Processing Unit (MPU). It performs operations on the input signals, which are received as collective magnetic oscillations, or converted into such inside or outside the MPU, or are represented by interaction with some external element, which results in some adjustments of the magnetization distribution inside the MPU and/or of the parameters characterizing the environmental variables inside the MPU. It outputs the result into the output channels as signals that exist either as collective magnetic oscillations, or transformed from such into some other form (electrical currents, electro-magnetic fields or other) inside or outside the MPU. The MPU contains one or more magnetic elements within which the operations are performed by means of excitation and interaction between collective magnetic oscillations and/or the interaction between collective magnetic oscillations and the magnetic material from which magnetic element or elements are made of. At least some portion of magnetic elements possesses some manner of anisotropy, which makes a specific direction or directions of magnetization to be preferred. This anisotropy can be determined solely by or by any combination of the following: the properties of magnetic material or materials used (for example, magnetocrystalline anisotropy), by the way magnetic material is shaped (shape anisotropy), by means of the application of the external magnetic field, by exchange anisotropy, and so on. One of the key distinctions from previously proposed devices, is that a significant portion of MPU's functionality is determined by the spatial distribution of the magnetization within each magnetic element, which can be adjusted by a variety of means discussed within this disclosure. In a general case, such adjustment means some specific change of magnetization direction and/or of magnetization amplitude within certain parts of a magnetic element. In one possible implementation of significant practical importance at least some of the magnetic element's materials have uniaxial anisotropy, in which case there are two preferred magnetization states, both with the magnetization aligned mostly parallel to the so called easy axis, but with mostly the opposite projections of the magnetization vector on the easy axis. In this case the adjustment of magnetization means choosing one out of these two preferred states in some specific portion of the magnetic element, i.e. a "magnetization reversal" from one state to another. From now on for the sake of brevity we will refer to any adjustment of magnetization in the magnetic element as "magnetization reversal", including the most general case when the magnetization is being realigned in some arbitrary direction, and its magnitude can potentially also be affected, i.e. "magnetization reversal" is considered by us to by synonymous to some "magnetization distribution". There is a distinction from previously proposed devices operating by means of domain wall motion is that the "magnetization reversal" in the current disclosure does not, in general, constitutes specifically a domain wall motion, but rather affects magnetization in a specific area of limited size within the MPU's magnetic element. The size and location of the area affected depends on the design of the element used for the magnetization reversal as well as on properties of the magnetic material, rather than on intrinsic properties of domain wall motion per se. Besides the "magnetization reversal" MPU's functionality can be adjusted by means of applying to some portions of the magnetic elements magnetic field, spin torque, temperature, electromagnetic waves, and by other phenomena which result in alteration of magnetic element's magnetic properties. All of such are referred by us as "environmental variables".

FIG. 1 is a schematic representation of an example of a Magnetic Processing Unit ("MPU") in accordance with aspects of the present disclosure, which includes one or more input channels 101, one or more output channels 102, and a magnetic element or elements which contains magnetic material or materials 100. The signals inside the MPU exist predominantly as collective oscillations of the magnetization, i.e. spin waves. There is a coexistance between the collective magnetic oscillations and time dependent magnetic fields, so in regards to any magnetic materials, whether a part of the input channels 101, output channels 102, magnetic element 100, any other device, we presume that the time dependent magnetic fields generate collective magnetic oscillations and vice versa. In some embodiments considered in the present disclosure the signals in the input and output channels 101, 102 either enter the MPU's magnetic element 100 as time dependent magnetic fields or collective magnetic oscillations, or converted into such inside the magnetic element 100. Accordingly, in one possible embodiment there are optional elements that are responsible for converting the signals in the input and/or output channel or channels from and/or to precessions of the magnetization in order to facilitate the functionality of the MPU as part of some larger system. In one particular embodiment the electrical currents supplied to the MPU are converted into collective magnetization precessions by means of some device internal to the MPU, including, but not limited to, STO or other generator of time dependent magnetic fields which couple to the magnetic material in the MPU's magnetic element.

Figure 15:
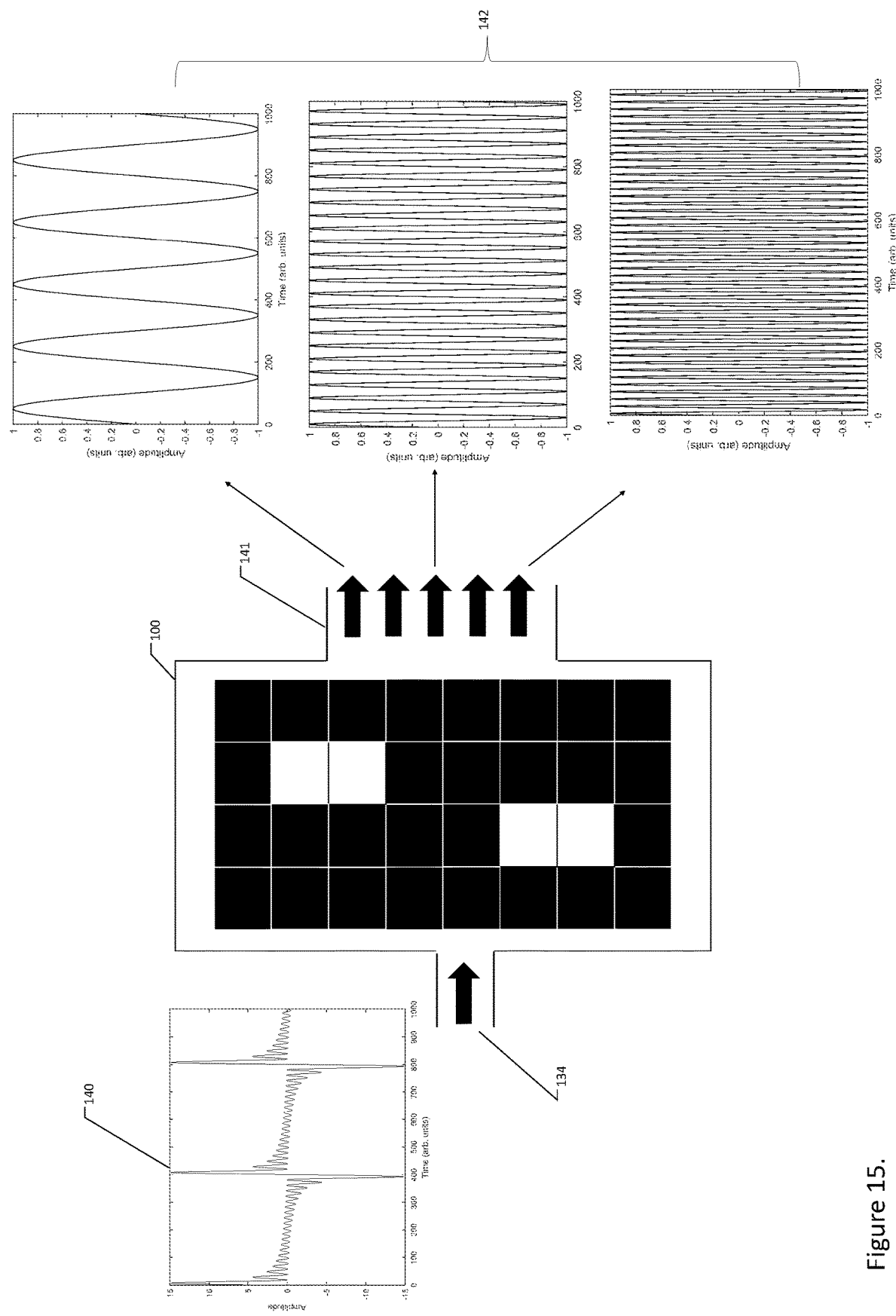

It has to be noted that the output and/or input channels for all embodiments in the present disclosure can be physically separated from each other (as physically separate wires, by the MPU's geometry, by magnetic, physical or other properties of the MPU's materials), or at least some of them (for example, as in FIG. 15) can form a continuous space, with different signals occupying different areas of such space. In one embodiment the input and/or output channel or channels deliver signals with continuously changing properties in space and/or time, rather than a well defined integer number of separable and distinguishable signals.

Figure 2:
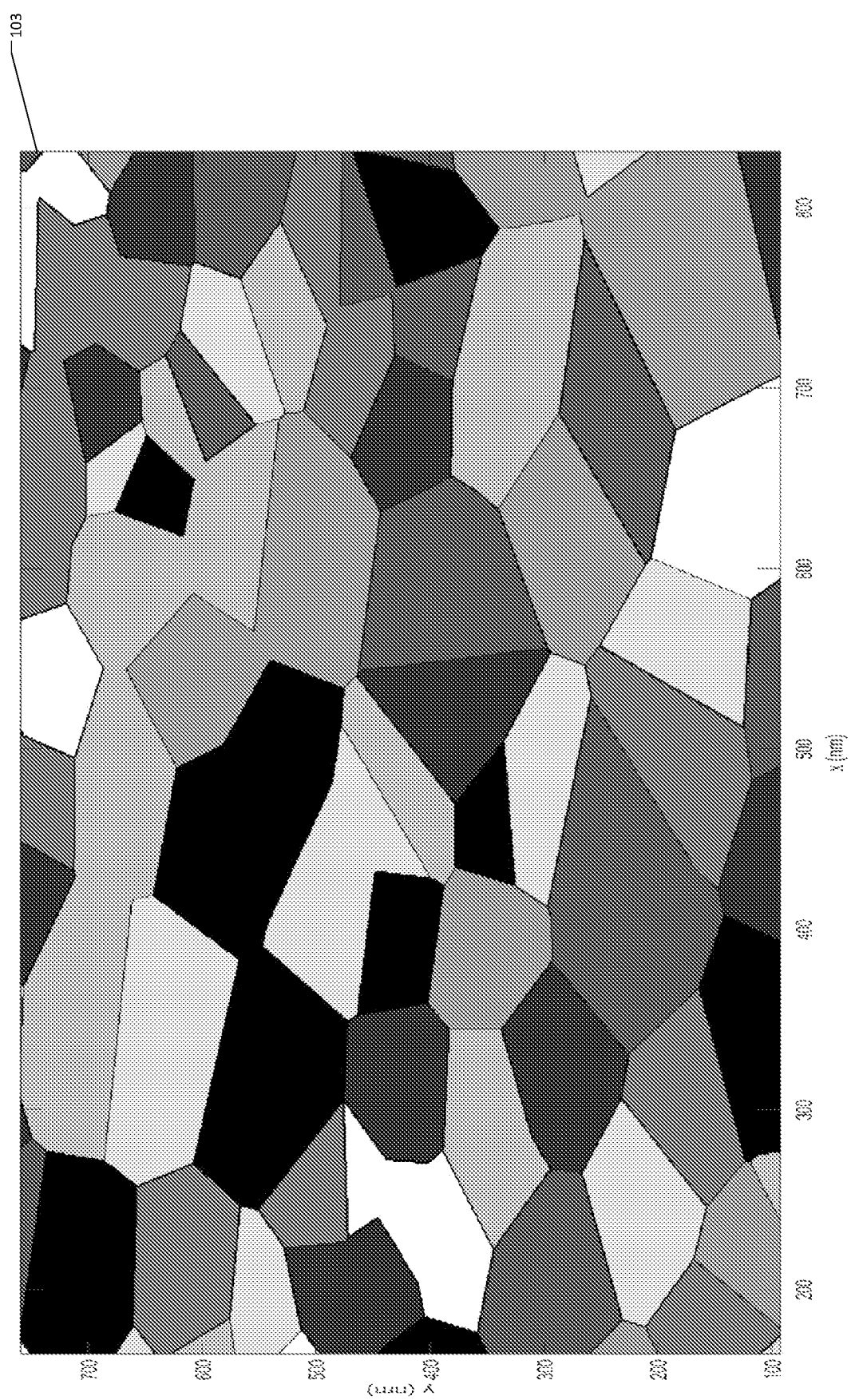
FIG. 2 illustrates an example of magnetic materials of the MPU having a granular structure.
Figure 3B:
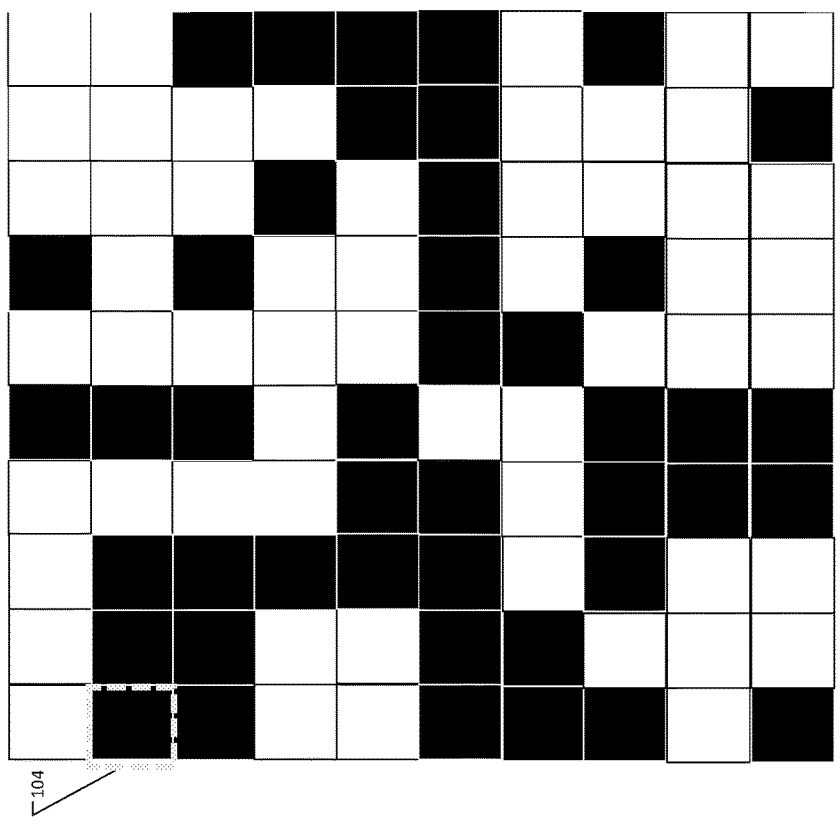
FIGS. 3A-3B conceptually illustrate examples of magnetic orientations of the magnetic element of the MPU.

In one example embodiment the magnetic element 100 includes single and/or multiple layers 103 made from one or more magnetic materials and possibly layers of non-magnetic materials. Some of the materials can have a granular structure, where the properties of magnetic materials remain more or less continuous within each grain, but the interaction between grains can generally be weaker compared to that within the grain. A modeled example of such grains distributed over a thin slab with the thickness direction perpendicular to the image's plane is shown in FIG. 2. Here the different shades of gray denote different individual grains. Presence of grains allows for localized magnetization reversal, as the intergrain boundary helps to establish a boundary between the areas with different magnetization. Even though elements of the current disclosure are applicable to the most general case, in which the magnetization has a few preferred directions, for the sake of simplicity drawings herein will address a specific scenario, in which there are only two predominant orientations (for example, due to presence of uniaxial anisotropy) with mostly opposite directions of magnetization. In this case, starting with the FIGS. 3A and 3B the "up", out of plane orientation is denoted by the black color while the opposite, "down", into the plane orientation, is denoted by the white color. However, the choice of a particular direction, "up" versus "down" in the Figures is an abstraction which reflects a possibility of "magnetization reversal" rather than any particular magnetization pattern.

Figure 3A:
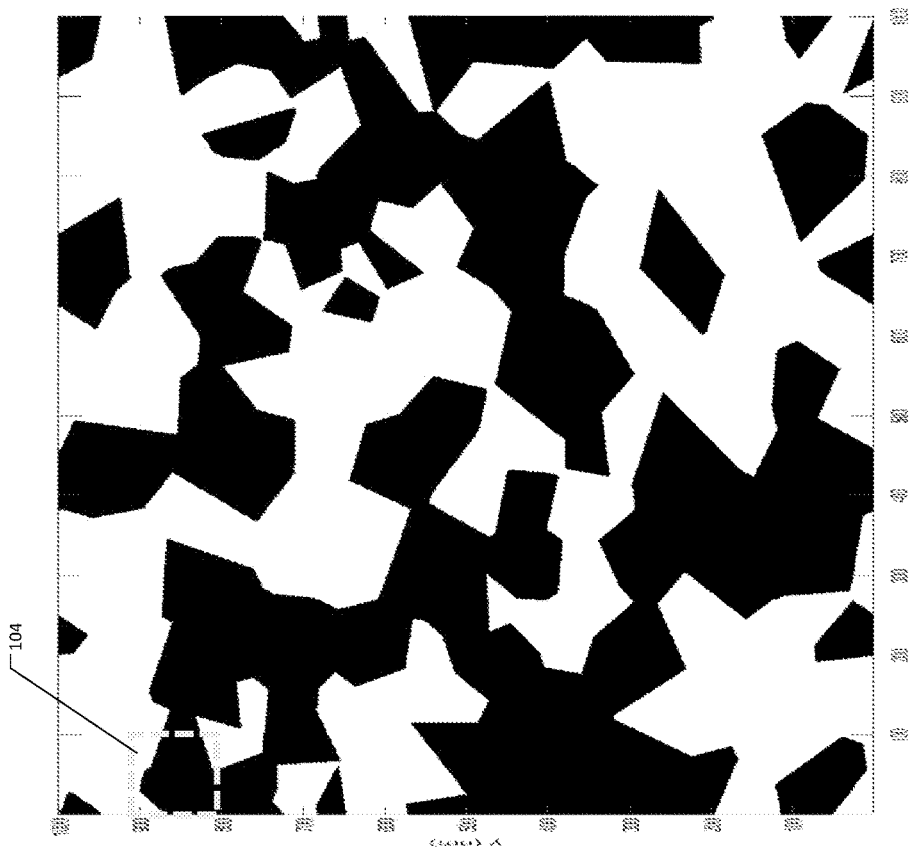

In FIG. 3A we demonstrate some magnetization distribution which is obtained by magnetization reversal of particular grains in the "up" or "down" direction, using the same grain configuration as shown in FIG. 2. When it comes to MPU performance, it is expected to be adjusted by means of magnetization reversal in specific areas. Each such area represents a fragment of magnetic material or materials 104 where the magnetization can be reversed with limited impact on other areas, i.e. it can be said to be "individually addressable" during the magnetization reversal. These "individually addressable" areas can all be of the same or different size and or shape. Their size, shape and location can be in some embodiments adjusted without changing the magnetic element's material, i.e. magnetization reversal occurs where it is allowed by the magnetic element's material properties and depending on the functionality needed from the MPU.

The MPU functionality depends to the first order on average magnetization in these areas. In case of granular materials, there are can be grains belonging to one specific "individually addressable" area, there are can be grains shared by two or more different "individually addressable" areas. As an example, in FIG. 3A and 3B we assume that these individually addressable areas form a rectangular matrix, to which we assign orientation "up" or "down", denoted by black or white color respectively, depending on whether the average magnetization in this area, as computed from FIG. 3A is oriented in the out of plane or into the plane direction. The same nomenclature will be used throughout the rest of the present disclosure for all kinds of magnetic materials, granular and non-granular. The choice or rectangular matrix represents an abstraction, a particular implementation chosen for the sake of simplicity, while in a more general case the arrangement and shape of individually addressable areas can be arbitrary. The implementations involving hexagonal, and/or rectangular and/or more complex shaped arrays of individually addressable areas are expected to be of practical importance.

Figure 5A:
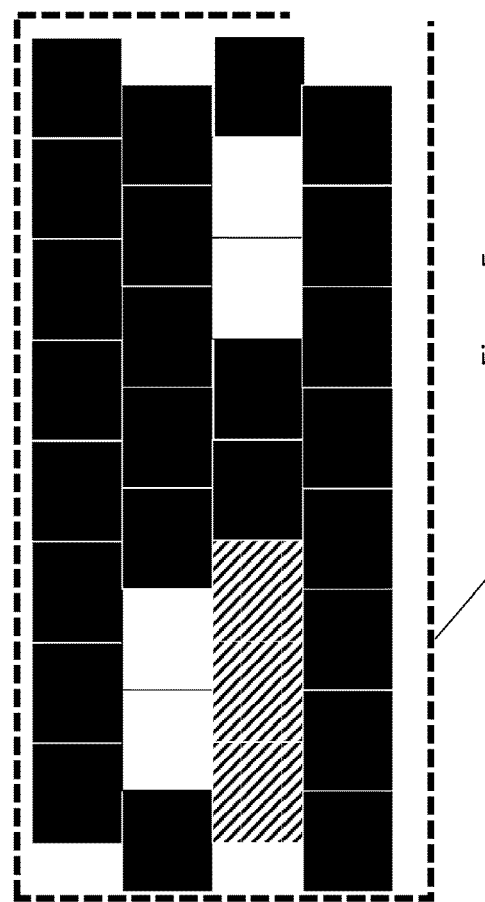
FIGS. 5A-5C illustrate further aspects of the magnetic element shown in FIG. 4.
Figure 5B:
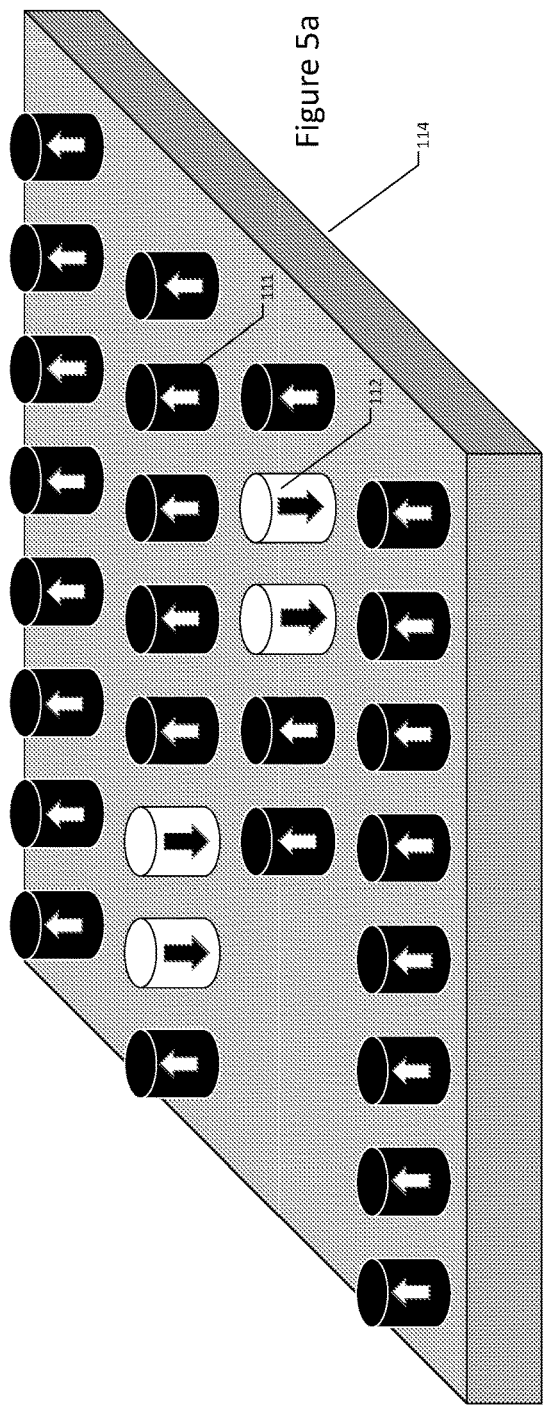
Figure 5C:
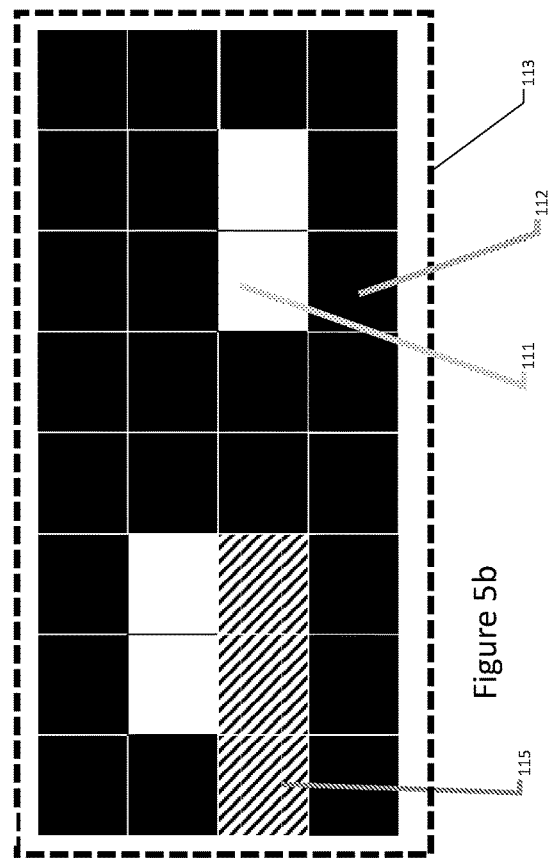
Figure 12:
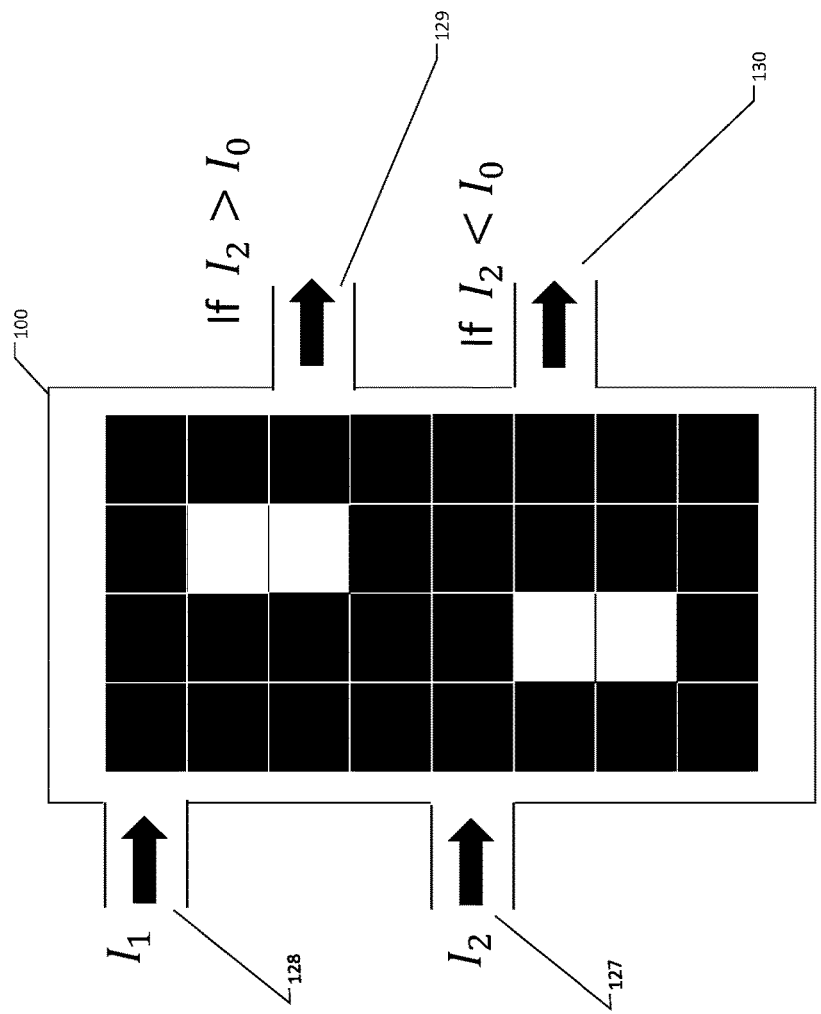

In other example embodiment shown in FIGS. 4-4D, the magnetic element 100 includes a patterned array 106 of magnetic "dots" 105. The shape of each dot can be spherical, conical, bar-shaped, cylindrical 105, prism 107 or other. In one possible embodiment the magnetic element includes magnetic dots whose anisotropy is determined at least in part by their shape and possibly also their material's properties. In one possible embodiment magnetic element includes magnetic dots whose shape is elongated in the "out of plane direction" and thus shape anisotropy is also oriented in the "out of plane direction". The mutual arrangement of dots in the array 104 can form a rectangular 108, hexagonal 106 or other mesh. Each dot can be composed from one or more 109 magnetic and/or non-magnetic materials. The dots can be combined with continuous layers 110 composed from one or multiple magnetic and/or non-magnetic materials. In one possible embodiment the properties of layers of continuous magnetic materials are such so to achieve the desirable level of the mutual interaction between the dots through dipole-dipole and/or exchange forces. In terms of magnetization reversal in the most general case individually addressable areas can include one or few individual dots as well as, possibly, certain area of continuous magnetic material or materials, which can include one or more grains for a granular material. Still for the sake of simplicity from now on we will employ in figures an abstraction that corresponds to a specific case FIGS. 5A-5C, when each dot can be individually addressed (i.e. its magnetization reversed), and its magnetization defines the magnetization of the corresponding individually addressable area. Thus the area can include continuous materials 114, possibly including granular magnetic materials, but their magnetization is still determined by that of the nearby dot. For the sake of simplicity, similar to the previous case of granular materials shown in FIG. 3A, while in general case each individually addressable area can be characterized by average magnetization which has multiple possible states, with arbitrary directions and magnitudes of the magnetization, we consider in the consequent figures a specific case where dots and/or individually addressable areas have uniaxial anisotropy and can be in either of the two magnetization states, correspondingly with predominantly out of plane 111 or into the plane 112 magnetization. From now on we denote the out of plane orientation of magnetization by black color 111, while use white color for the into the plane magnetization 112. Just as with granular materials, this allows us to greatly simplify the representation of MPU's magnetic element 100, which in general is a three dimensional structure made from some combination of continuous materials or materials 144 and/or dot array or arrays 111,112 with arbitrary shaped and positioned individually addressable areas, by using an abstract two dimensional mesh 113 with cells representing individually addressable areas painted black or white representing individually addressable areas and denoting the predominant orientation of per cell averaged magnetization— either out of plane (black) 111 or into the plane (white) 112. In such systems some cells (areas) can lack magnetic properties and are denoted as dashed 115 cells in two dimensional representation. While rectangular mesh of individually addressable cells is being used as default in most figures in the current disclosure, this is an abstraction, and other arrangements, such as 116 and others are possible implementations for each and every aspect of the current disclosure. Beginning with FIG. 12 we apply the abstraction introduced in FIGS. 5A-5C to use a two dimensional representation of a matrix of addressable cells to denote an arbitrary MPU's magnetic element 100. Also, unless noted otherwise, the choice of which cells' magnetization points out of plane (the cells are colored black) and which is into the plane (the cells are colored white) is arbitrary and serves purely to illustrate that some magnetization pattern exists in a magnetic element for the purpose of enabling its specific functionality.

There is an optional element sometimes referred to herein as a magnetic programmer 117, 118, 119, 120, 121, 122, 123, 124, 125, 126, 127, 128 shown in FIGS. 6, 7 ,8, 9, 10, 11, which alters the magnetization in the magnetic element 100 and/or environmental variables or some physical properties which impact the magnetization dynamics in the magnetic element 100.

In one embodiment shown in FIG. 6, such element is a conducting wire or wires 117 placed in proximity to, or at least partially directly within the MPU's magnetic element 100. The current flowing through the wire or wires 117 generates magnetic field, which either directly or in combination with other effects affects the magnetization and/or other properties of the magnetic element 100.

Figure 7:
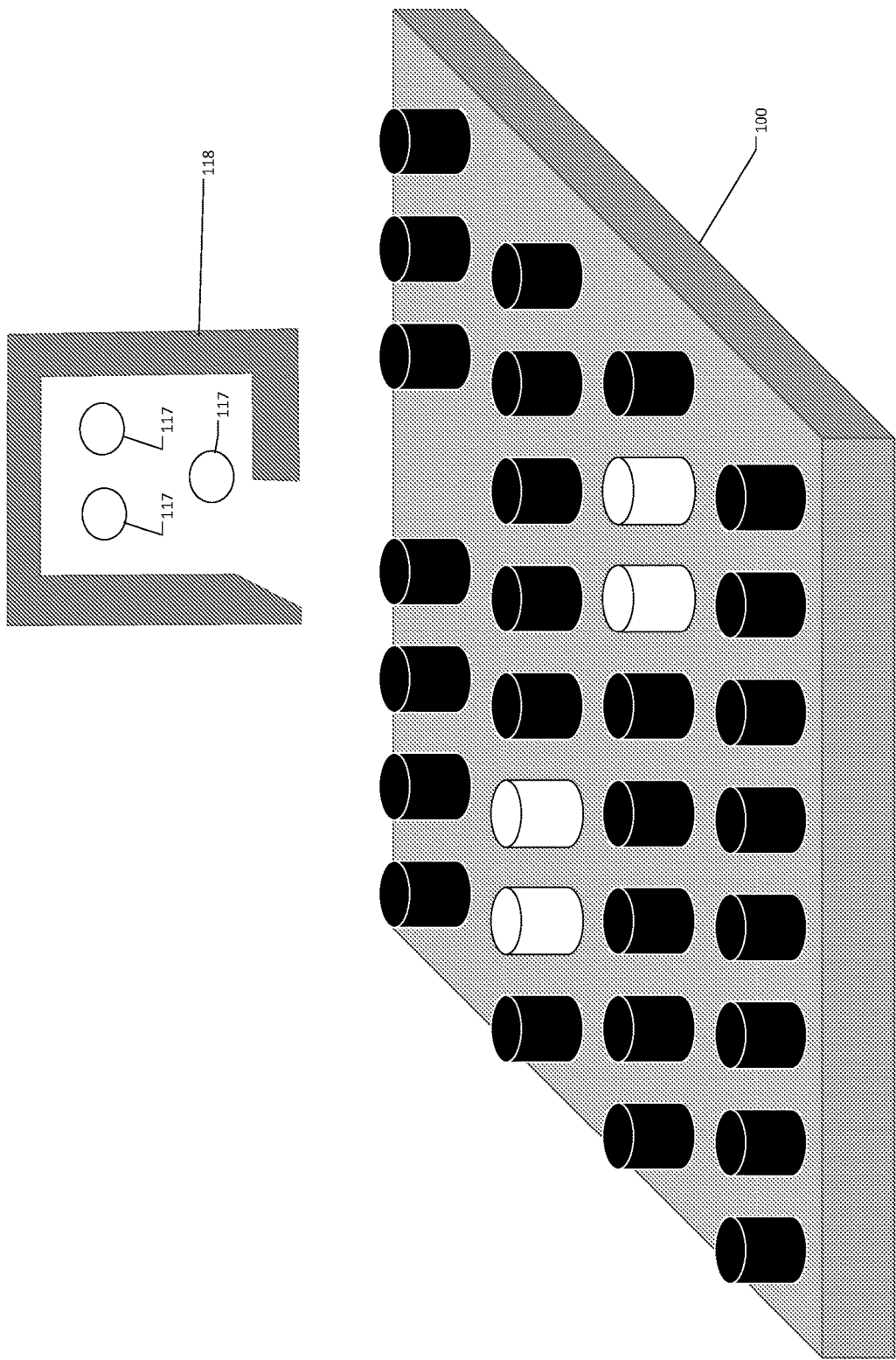

In one possible embodiment shown in FIG. 7, in addition to such wire or wires 117 there are additional magnetic structures 118, which are magnetized by the wires and as a result impact the amplitude and direction of the magnetic field in the MPU's magnetic element 100. In one particular embodiment the magnetic wires 117 and magnetic materials 118 are analogous to a magnetic write head used in magnetic recording industry. In this case to access and impact different portions of the MPU either a write head or the MPU are physically moved with respect to one another until the recoding head and the location it is supposed to affect are located in close proximity to one another. More than one write head can be employed as part of this embodiment.

Figure 8:
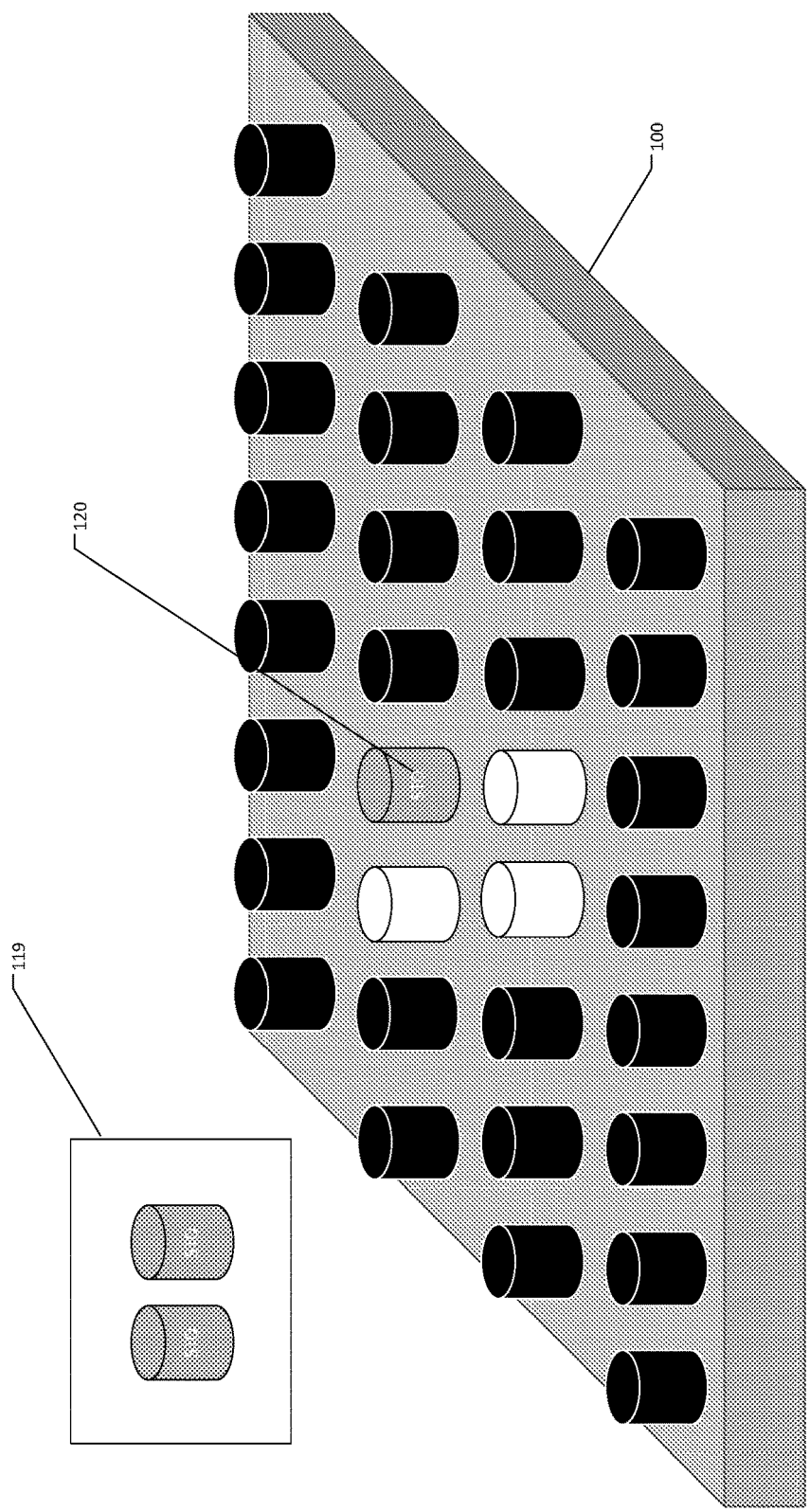

In one embodiment shown in FIG. 8, such element is one or multiple spin torque oscillators (STO) 119, 120. In the illustrated example, the STO 119 is placed in proximity to the material of MPU's magnetic element 100 and the STO 120 is placed within the material of MPU's magnetic element 100. The STO 119, 120 generate a time dependent magnetic field which interacts with the MPU's magnetic element 100. STO can be synchronized with magnetic oscillations propagating in the MPU's magnetic element 100. STO can be synchronized with magnetic fields and/or magnetic oscillations that are being received by the input and/or output channel of the magnetic element 100. Multiple STOs can be used to form a phase-synchronized array. The design of STO 118, 119 also incorporates additional elements (wires and others) needed for their performance.

Figure 9:
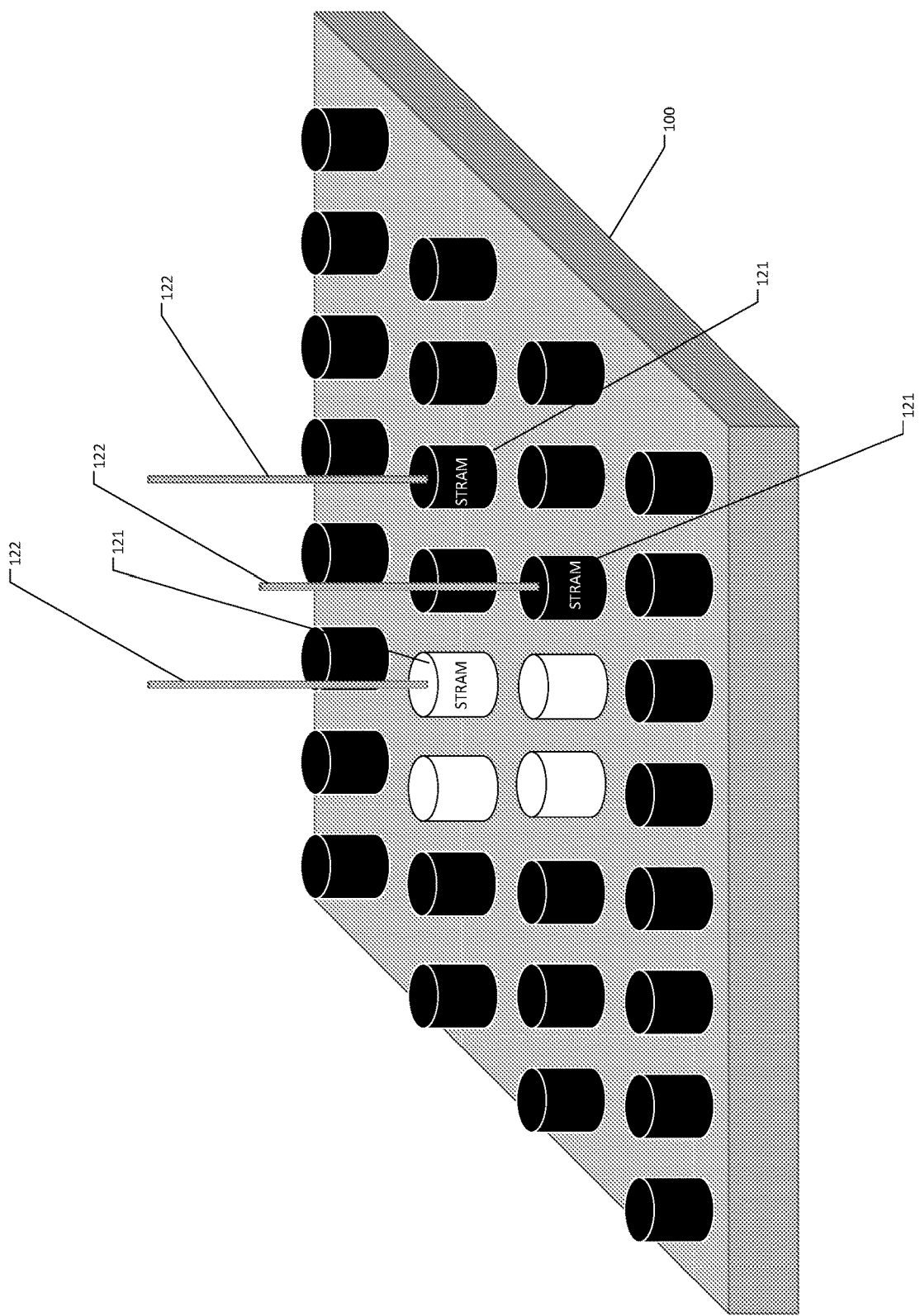

In one embodiment shown in FIG. 9, such element is one or multiple wires 122 connected to one or more of the dots 121 in the MPU's magnetic element 100 with the design of the dots 121 being such that their magnetization can be reversed by means of spin transfer torque effect, effectively making these dots spin torque random access memory (STRAM) cells. It is possible that their magnetization reversal will impact some area neighboring to the dot 121, thus the "individually addressable" area can be of substantially larger size than the STRAM cells 121 themselves. In on embodiment instead of dots 121 a continuous magnetic material is used, but still its magnetization is reversed by means of spin torque effect, for example, by using a nano-pillar probe.

All of the above mentioned embodiments FIGS. 6-9 can be used for both or either of the two effects—magnetization reversal and adjustment of environmental variables. By the latter case we understand the action which affects the performance of the MPU without necessarily leading to the magnetization reversal. An example of such is application of the external magnetic field by an optional element as per FIGS. 6-8.

A disclosed factor that can affect MPU performance through both or either of magnetization reversal or altering the properties of magnetic materials is temperature within at least some portion of the MPU. The temperature change can have a combined affect with the external magnetic field, for example generated per the above mentioned embodiment FIGS. 6-8, application of spin transfer torque FIG. 9, and/or with other magnetic fields and/or magnetic oscillations that exist in the MPU's magnetic element resulting in the magnetization reversal, which can be used to form a desired magnetization in the MPU's magnetic element 100. In one embodiment the temperature change in part of whole of the MPU is such so that a portion or whole of the MPU's magnetic element can experience magnetization reversal with a finite probability during the expected duration of the MPU's operation. This can create uncertainty in the result of MPU's operation or in its input parameters, internal variables or algorithms used for the computation by the MPU. This can be beneficial for a number of applications, including, but not limited to, random number generations, Neural Networks and others. The impact of temperature change is not limited to magnetization reversal or, more generally speaking, a probability of magnetization reversal. In one embodiment, as environmental variable, it affects a number of properties of magnetic materials, including but not limited to, magnetic anisotropy and saturation magnetization, and thus directly impacts the results of MPU operations.

In one embodiment the temperature of the MPU's magnetic element changes as a whole with the adjustments in the ambient temperature. In one embodiment the temperature of some portion of the MPU's magnetic element FIG. 6 can be increased by the heat generated by the wires 117 which are conducting electric current and are placed in direct proximity or within the area being heated.

Figure 10:
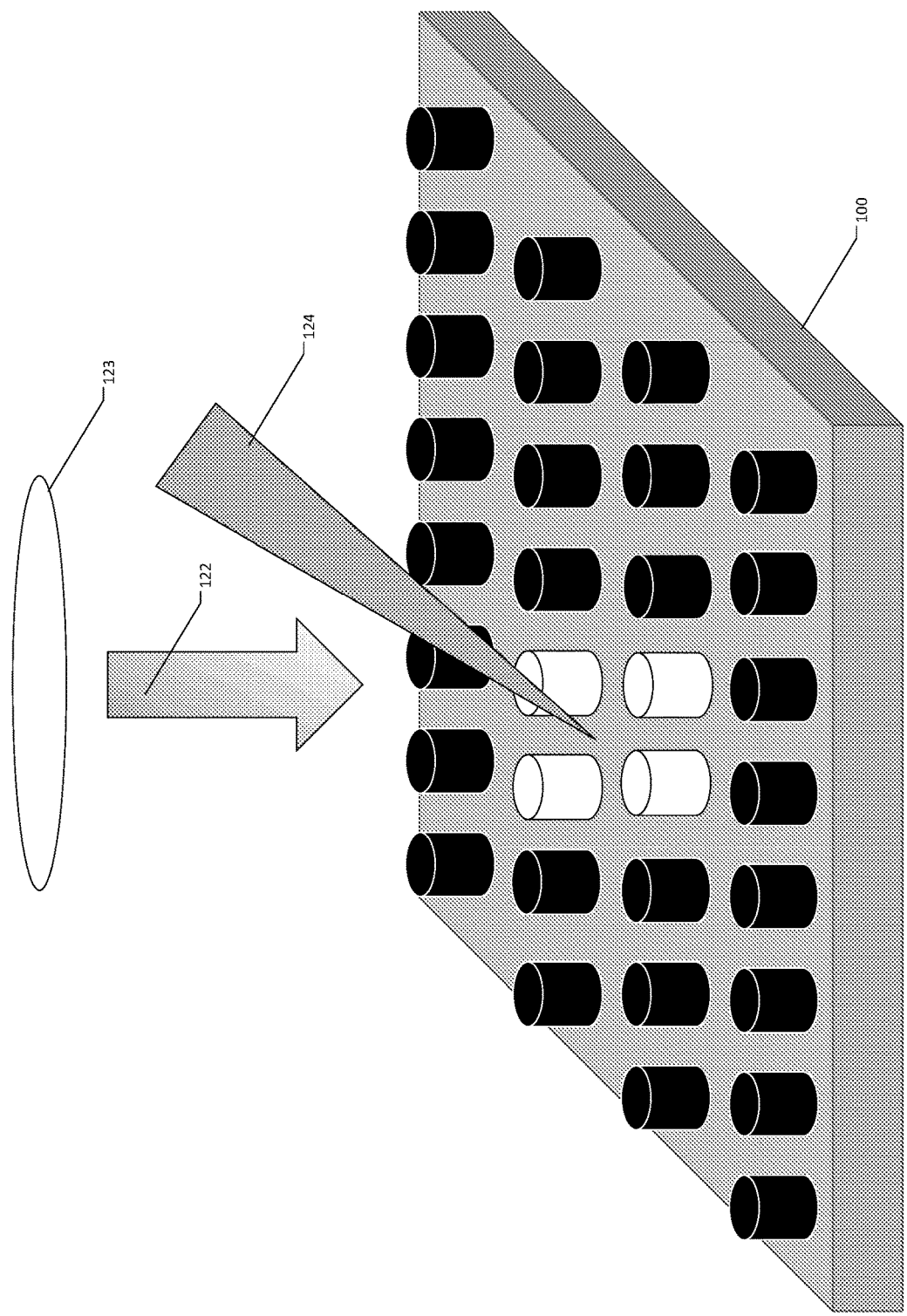

In one embodiment shown in FIG. 10, the temperature of some portion of the MPU's magnetic element can be increased by the application of optical radiation 122. It can be optionally focused by an optical element 123, such as lens, mirror or another focusing element. It can be focused with the help of a near field device 124, including but not limited to such elements as plasmonic tip, aperture, refraction grid and so on. Optical element or elements 123 and near field device or devices 124 can be combined together to improve the system's performance.

Figure 11:
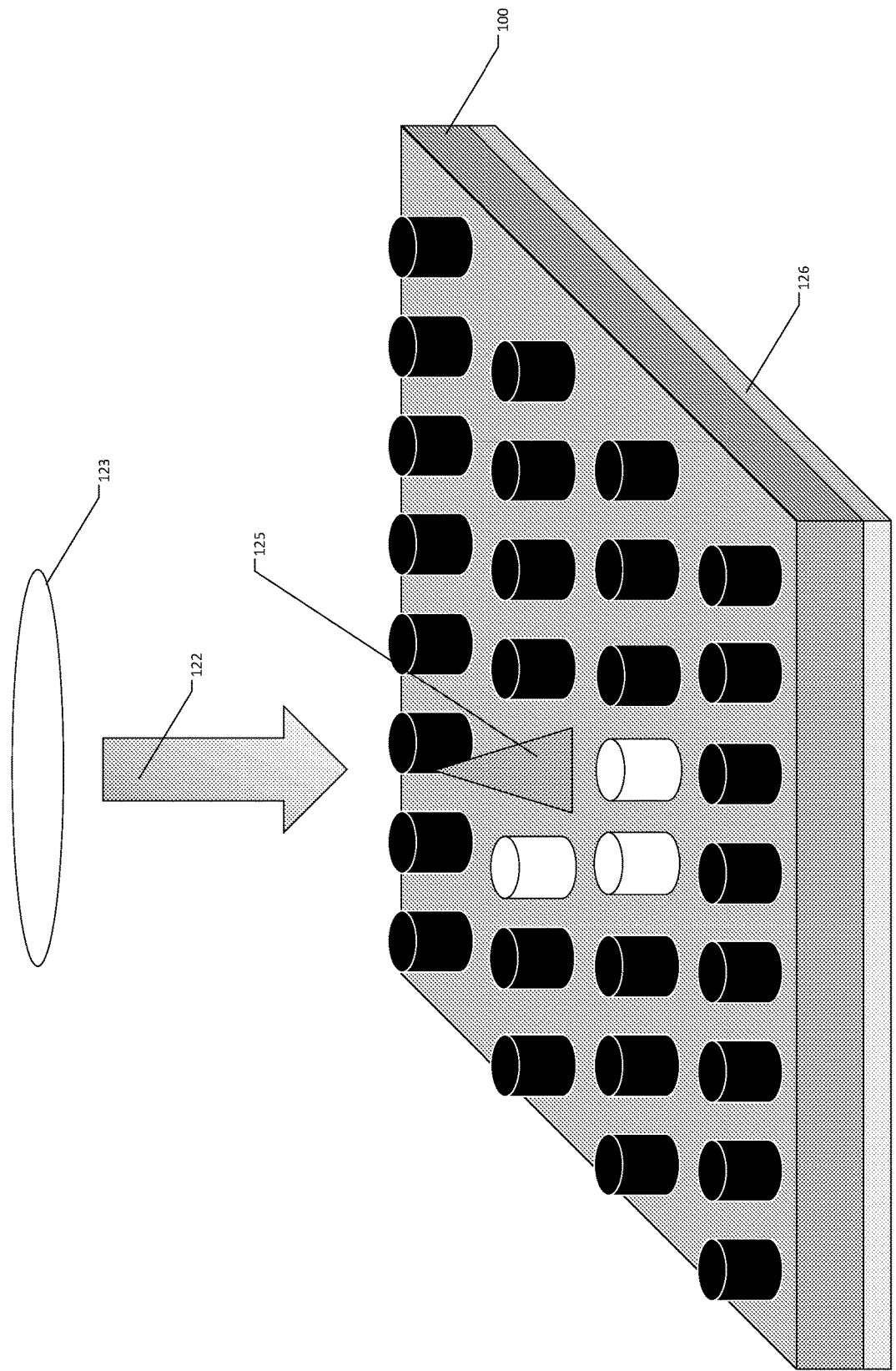

In one embodiment shown in FIG. 11 the near field device or devices are positioned within or in a close proximity to the MPU's magnetic element 100. An example implementations include, but are not limited to, a plasmonic tip, plasmonic sphere or other element embedded 125 within the MPU's magnetic element 100 or placed in a direct proximity to it, and/or layer or layers 126 of plasmonic material or materials placed within or in close proximity to the MPU's magnetic element 100.

In one embodiment some combination of elements in the above mentioned embodiments designed to perform the "magnetization reversal" and/or alter the "environmental variables" in the magnetic element 100 of the MPU. Such combination of elements may include a write head or heads i.e. wires with current 117 combined with some magnetic structure 118, wires with current 117, spin torque effect based elements 121, 119, 120, optical elements 122, 123, 124, 125, 126, or other elements with similar or different functionality. The elements designed to perform the "magnetization reversal" and/or alter the "environmental variables" in the magnetic element of the MPU can be a permanent part of the MPU, or attached or placed in proximity to it only when the MPU's operating parameters are in need of adjustment. In one embodiment there is one element or combination of elements which performs all the necessary adjustments. In one embodiment there are multiple elements, which differ in functionality and/or typically deployed for different areas of the MPU's magnetic element 100. For example, some operational parameters and corresponding portions of the MPU's magnetic element 100 can be altered by permanently affixed STRAM elements FIG. 9 121, while others—by write heads 117,118 which needs to be physically moved into proximity to the area being affected.

The "magnetization reversal" and/or the alteration of the "environmental variables" can occur during the operation of the MPU as well as when MPU performs no other functionality except for the said alteration itself. It is expected that this can correlate with the functionality of the sections of the MPU being affected. For example, those responsible for the core algorithms or signal routing can be predominantly affected prior to the MPU's core functionality being activated, while those responsible for the input the MPU receives from the external systems can be affected more often during the MPU's operation.

Since time-dependent changes in environmental variables can generate time dependent magnetic oscillations, each of the above mentioned embodiments FIGS. 6-11 or their combination, i.e. a combination of elements that might include write head or heads 117, 118, wires with current 117, spin torque effect based elements 121, 119, 120, optical elements 122, 123, 124, 125, 126 can be used to generate time collective magnetic oscillations which can be employed as input signals for the MPU, to boost the signal power inside the MPU, to alter the MPU's functionality, and so on. For example, an embodiment as shown in FIG. 10 with or without the optional near field element 124, when an optical radiation 122 is a short laser pulse, can be applied to a magnetic material 100 to generate magnetic oscillations at the range frequencies close to the magnetic resonant frequency of the affected area. Any single device or a combination of single or multiple spin torque oscillators 119, 120, time dependent fields generated by wires 117 conducting time dependent currents, magnetic elements switched by spin torque effect 121 can be used by to generate time dependent magnetic oscillations and/or magnetic fields.

In one embodiment, a "desired dependency" is when the output channels are selected (activated) based on certain properties of either individual input channels or a certain combination of the input channels.

In one embodiment, the output channels are selected based on the amplitudes, phases or other parameters characterizing the signals in the input channels. In one possible example, for the signal amplitude in the input channels below certain threshold value the output signals are channeled predominantly into the first set of output channels, while above this value they are channel into another, second, set of output channels, which can in principle have common members with the first set. In one possible implementation FIG. 12, one or more of the input channels supply the information signal 127, while one or more of the input channels 128, provide the signal which determines to which specific output channels 129, 130 the information signals, or the results of some operation performed on them (weighted sum, Fourier transform or some other operation) are being routed to.

Any operation that result in a selection of the output channels can also be implemented as a selection of which specific portion of the MPU's magnetic element acts as the output channel.

The control over which of the available output and/or input channels are being activated, and/or where in the magnetic element the input and/or output channels are located, can also be at least in part accomplished by the "magnetization reversal" within the MPU's magnetic element, and/or alteration of some of the "environmental variables".

Figure 13:
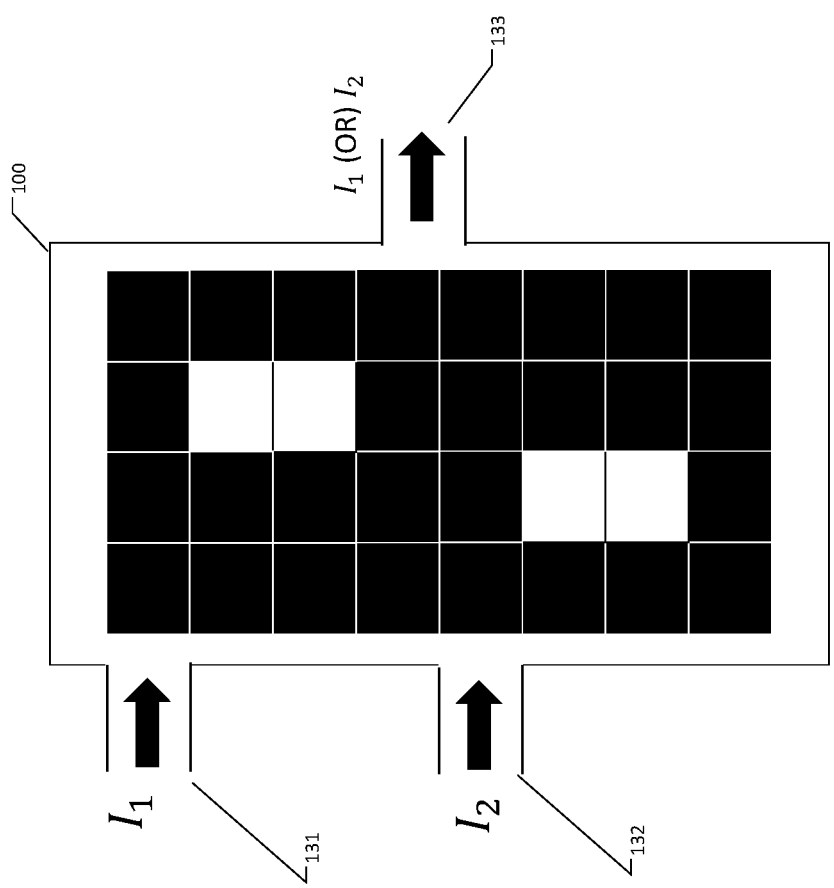

In one embodiment shown in FIG. 13 the output channel or channel 133 contain results of logical operations (such as AND, XOR, OR and so on) performed on the signals provided by the input channels 131, 132. The key distinction from previously proposed spin wave based logical elements is that in this case the nature of the logical operations being performed is largely determined by the magnetization pattern in the magnetic element 100. As with the rest of the embodiments in this disclosure we consider a particular case where magnetic element contains well defined areas whose magnetization can be reversed independently ("individually addressable"), in a contrast to other proposed mechanisms where the operation is either performed by uniformly magnetized magnetic devices, or with the help of a domain wall motion.

Figure 14:
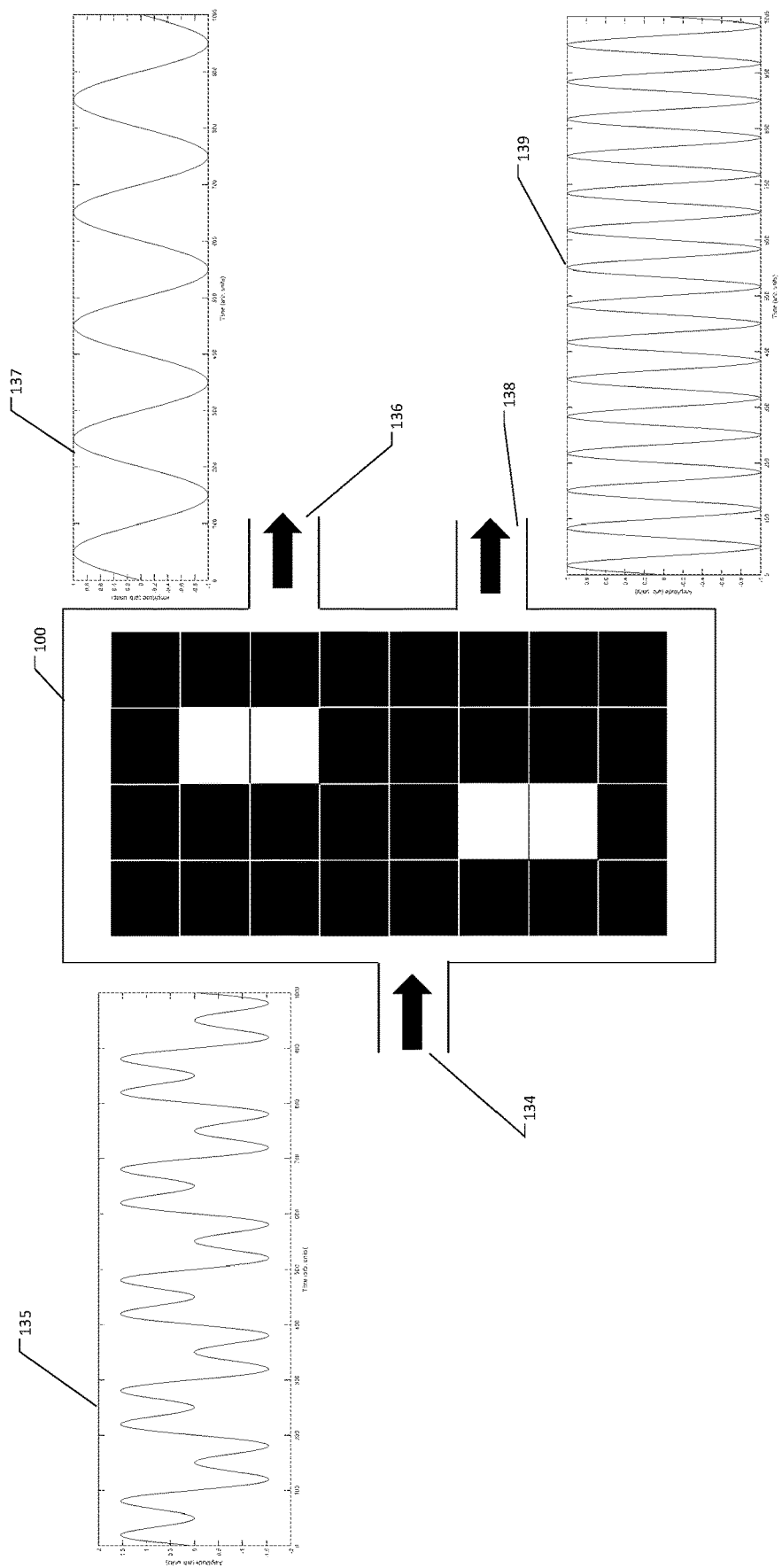

In one embodiment the output channels are selected based on the frequency or more generally, time dependence of the input signals. A particular case is when the MPU performs a Fourier transformation is shown in FIG. 14, with the input signal or signals 134 exhibiting an arbitrary mixture of frequencies, which are then decomposed into individual single frequency components (for example, the time dependence 135 decomposed into components 137 and 139) and channeled to corresponding separate channels 136, 138. As was noted before, in any embodiment such as shown in FIG. 15 the output 141 and/or input channels can represent a continuously changing signal rather than a set of physically separated channels. For the Fourier transformation in particular, there is a case when the multi-frequency (for example, with a time dependence 140) input 134 is decomposed into a continuously varying spectra, with each physical location within the output area 141 corresponding to a specific frequency component (for example, with a time dependence 142) of the input signal. While the embodiments of FIGS. 14-15 produce the output signals in a form of time-dependent, predominantly single frequency components, the modified embodiment exists where instead the outputs contain amplitudes, which reflect the amplitudes of specific frequency component of the input signal or signals.

Figure 16:
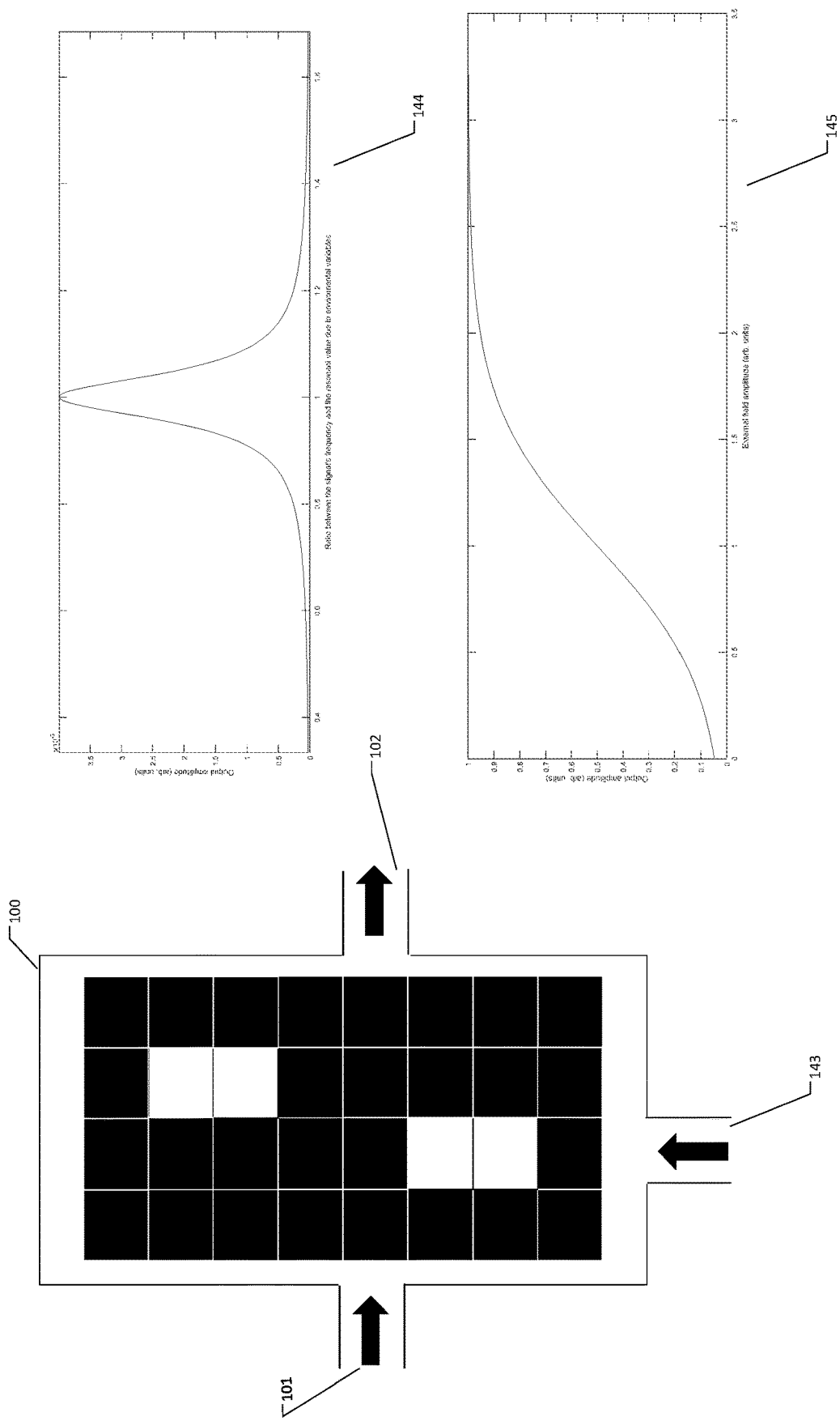

In one embodiment the "desired dependency" means achieving specific sensitivity of the output signal on specific properties of the input signal or signals (for example—frequency, phase, amplitude) and/or specific properties of the environmental variables (for example—temperature, external field amplitude and/or frequency) for the purpose of synchronizing with the input signal and/or estimating (measuring) certain properties of the environmental variable or variables. In the most general case shown in FIG. 16 the design of the MPU, and that of the magnetization distribution in its magnetic element 100, is such that a particular, desired dependence of the output signal or signals 102 is achieved with regards to specific changes in the environmental variable or variables 143 and/or properties of the input signal 101. For example, the output signal 144 can exhibit resonance properties, i.e. it reaches maximum amplitude when the input signal's frequency matches the resonant frequency of the MPU. The resonant frequency in turn is affected by the environmental variables, including, but not limited to the external magnetic field and temperature. Thus sweeping the frequency of the input signal (for example, as per 144) and/or the value of environmental variables allows one to determine whether the resonant conditions are being fulfilled and thus either synchronize the MPU to an external source of the time dependent magnetic field (the input signal) or to determine the value of the environmental variables. Alternatively, one can keep the input frequency constant while sweeping the values of the environmental variables in order to determine the input signal's frequency and/or amplitude as well as possibly synchronize the MPU operation with it. It should be noted that the use of magnetic materials with high anisotropy, including but not limited to certain rare earth materials and/or iron platinum alloys, and/or using high external magnetic fields allows one to operate in the frequency range reaching into hundreds of GHz, which is used for a number of practical applications. In one embodiment for a time-dependent external field it is possible by using a specific magnetization distribution and/or selecting a specific combination of properties of magnetic materials forming magnetic element 100 to have the output signal's amplitude achieve the desired (for example, predominantly linear or sigmoid 145 dependence on the amplitude of the external field within a certain range of external field's values and/or frequencies.

In one embodiment a "desired dependency" is when depending on a specific magnetization distribution and/or values of environmental variables the directional sensitivity of a magnetic element can be adjusted. For example, the input channel or channels might be receiving a signal or signals from an external source or sources of magnetic field, and adjusting magnetization distribution inside the magnetic element and/or values of the environmental variables allows the system to enhance the signal coming from a particular direction, for example, to focus on a specific source of the signal. Similarly, the output channels can be made to produce a propagating magnetic field, with the orientation of its wavefront (and corresponding direction of the propagation) controllable by the magnetization distribution and/or values of the environmental variables inside the MPU.

Figure 17:
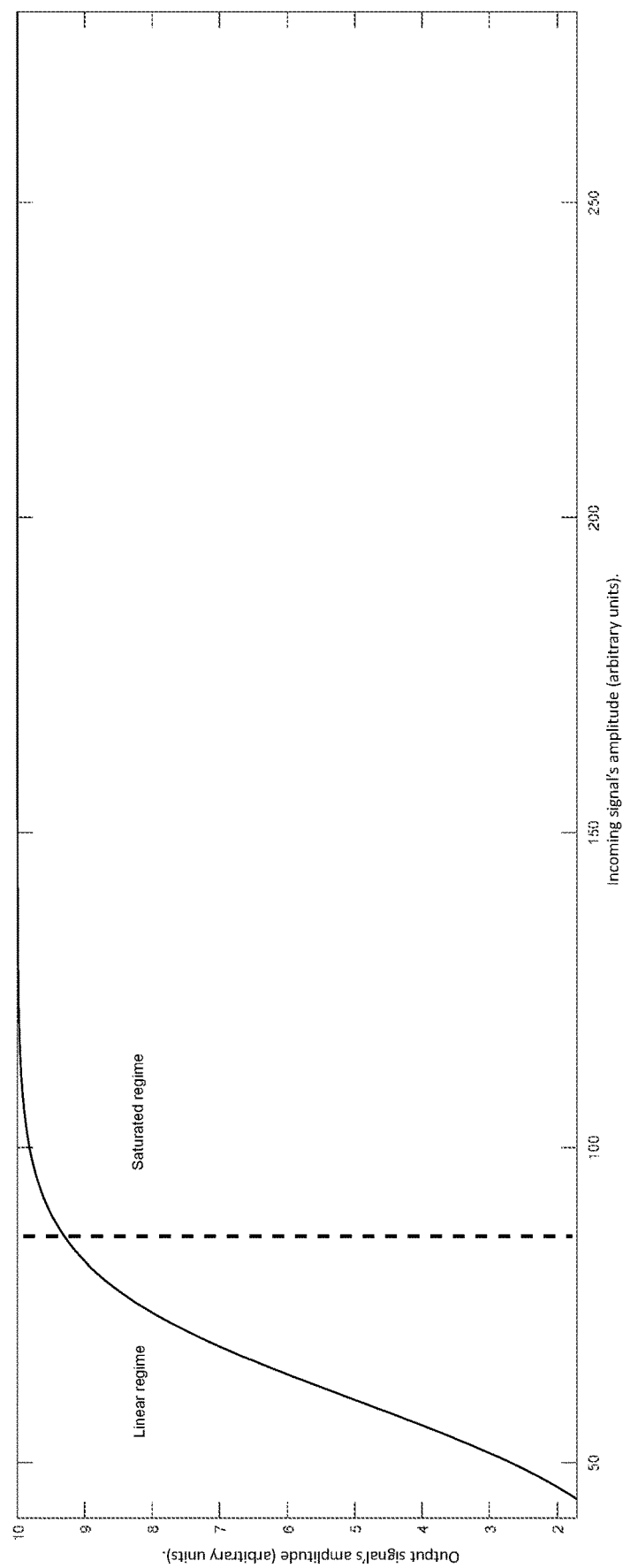

In one embodiment a "desired dependency" is when depending on various properties of the input signal or signals there are different regimes of operation, each corresponding to a specific dependency of the amplitudes of the output signals on the amplitude of the input signals. In one embodiment, there is a linear regime which occurs when the amplitude of the input signals (taken separately or as some combination) is below some threshold value as illustrated in FIG. 17. In this case the amplitude of the output signals linearly increases with the amplitude of the input signals. It is expected that for MPU such regime becomes unsustainable for high amplitudes of the input signals. In one implementation, above certain threshold amplitude of any or some of the input signals, or above some threshold amplitude of some combination of the input signals the system switches to the "saturated regime" of FIG. 17, where the amplitude of the output signal or signals does not exceed a certain value for all practically reasonable values of the input signal or signals, which can be also seen as a substantially diminished dependency of the output signals' amplitude on the amplitude of the input signals. Hereandafter we will refer to the type of "desired dependency" which exhibits at least two distinctive regimes of the relationship between the output and the input signals, such as the above mentioned "linear regime" and "saturated regime" as "non-linear saturation". In one particular embodiment there is also a third regime, which is activated for very low amplitudes of the input signals, and in which the output signal's amplitude changes very little with the amplitude of the input signal, i.e. remains close to some initial value, which can be zero in some implementations. Having the ability to adjust the value of the threshold amplitude which controls the switching between the different modes of operation is applicable to many practical applications. One of the possible implementations of the "non linear saturation" relies on non-linear interactions between the magnetic oscillations and the magnetic element 100, where large amplitude magnetic oscillations in the magnetic element 100 result in a shift of the resonant frequency, with the consequent off-resonant reduction of the propagation of the magnetic oscillations.

Figure 18:
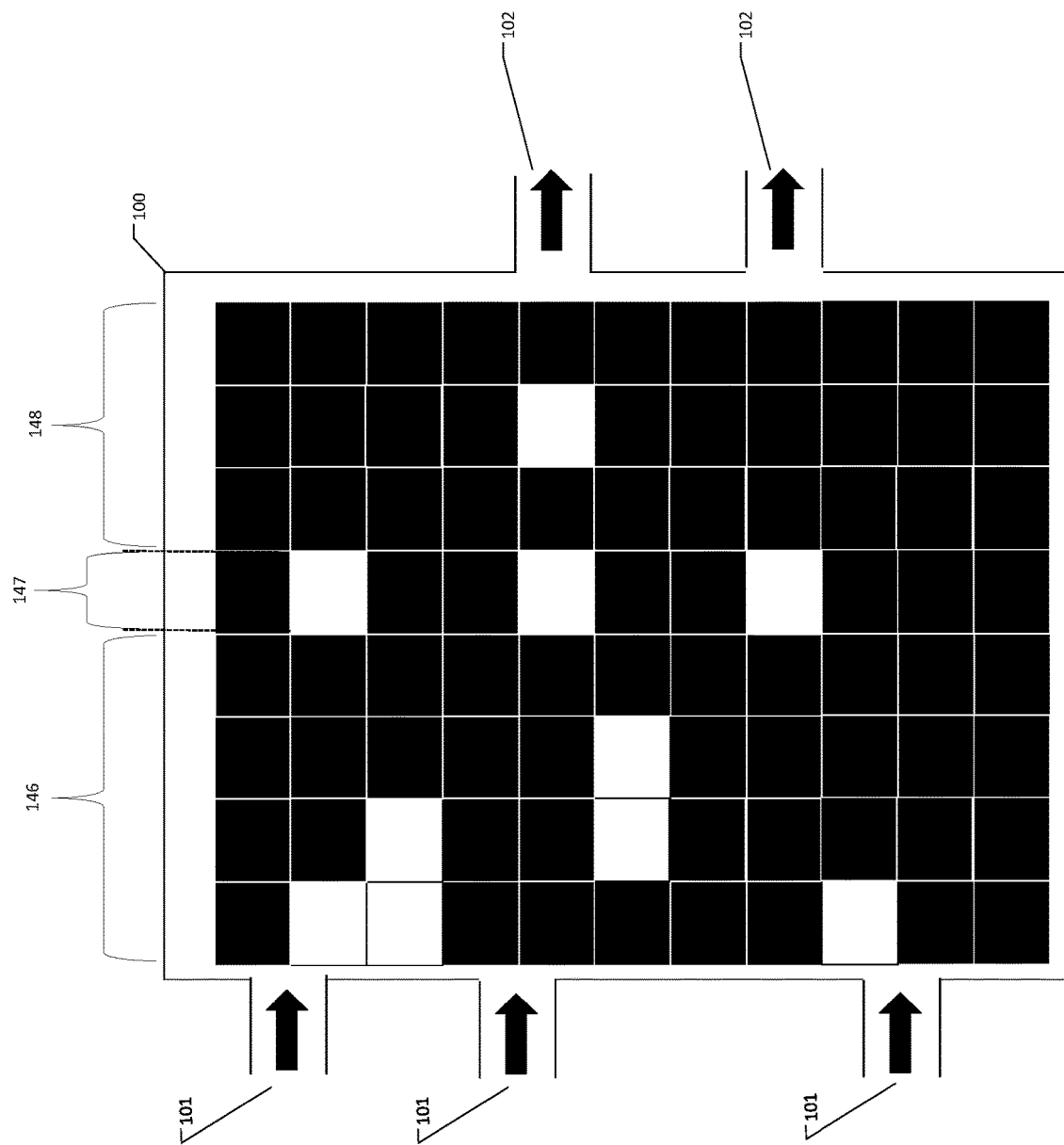

In one embodiment shown in FIG. 18 the system is designed so that depending on the of magnetization distribution ("magnetization reversal") within specific areas 146, 148 of the magnetic element or elements 100 located in single or multiple MPUs, possibly for certain combination of the "environmental variables" and/or parameters of the input signal or signals the output signal or signals 102 provide information regarding the magnetization's properties within a specific segment of the MPU's magnetic element 147. The shape, location and magnetization distribution of segments 146, 147, 148 depends on a particular implementation, and the depiction in FIG. 18, as are other Figures in the current disclosure, unless specifically noted otherwise, is an abstraction. One possible implementation relies on the capacity to focus the collective magnetic oscillations within the MPUs magnetic element by means of their interference with specific patterns of magnetization ("magnetization reversal"). It is then possible by switching between different magnetization patterns by means of the "magnetization reversal" of the corresponding areas within the segments 146, 148 of the magnetic element or elements 100 to focus the magnetic oscillations to a certain area 147 of the MPU's magnetic element, and also channel them afterwards to the output channel or channels 102, where the signal or signals are being analyzed to determine the magnetization state in the corresponding portion of the segment 147. Therefore the magnetic element 100 is expected to contain the "information storage" segment 147, the magnetization pattern of which can be accessed (read), the "scanning" area 146 which channels the magnetic oscillations from input channel or channels 101 towards specific areas of the stored information 147, and the area 147 which is responsible for delivering the magnetic oscillations from the stored information 147 to the output channel or channels 102. Certain quantum computing algorithms, such as Grover's can also be implemented by means of corresponding alterations of the magnetization in the segments 146, 148 and/or adjustment of the environmental variables, and possibly, properties of the input signal or signals. In one embodiment, the magnetic oscillations can be focused in the stored information area 147 with such amplitude so that, possibly in combination with the external magnetic field, temperature and/or other environmental variables, it accomplishes "magnetization reversal" in the area 147 and thus alters the information stored there. As a result we have a memory storage device the information in which can be both "read" and "written" using the interference of collective magnetic oscillations.

Figure 19:
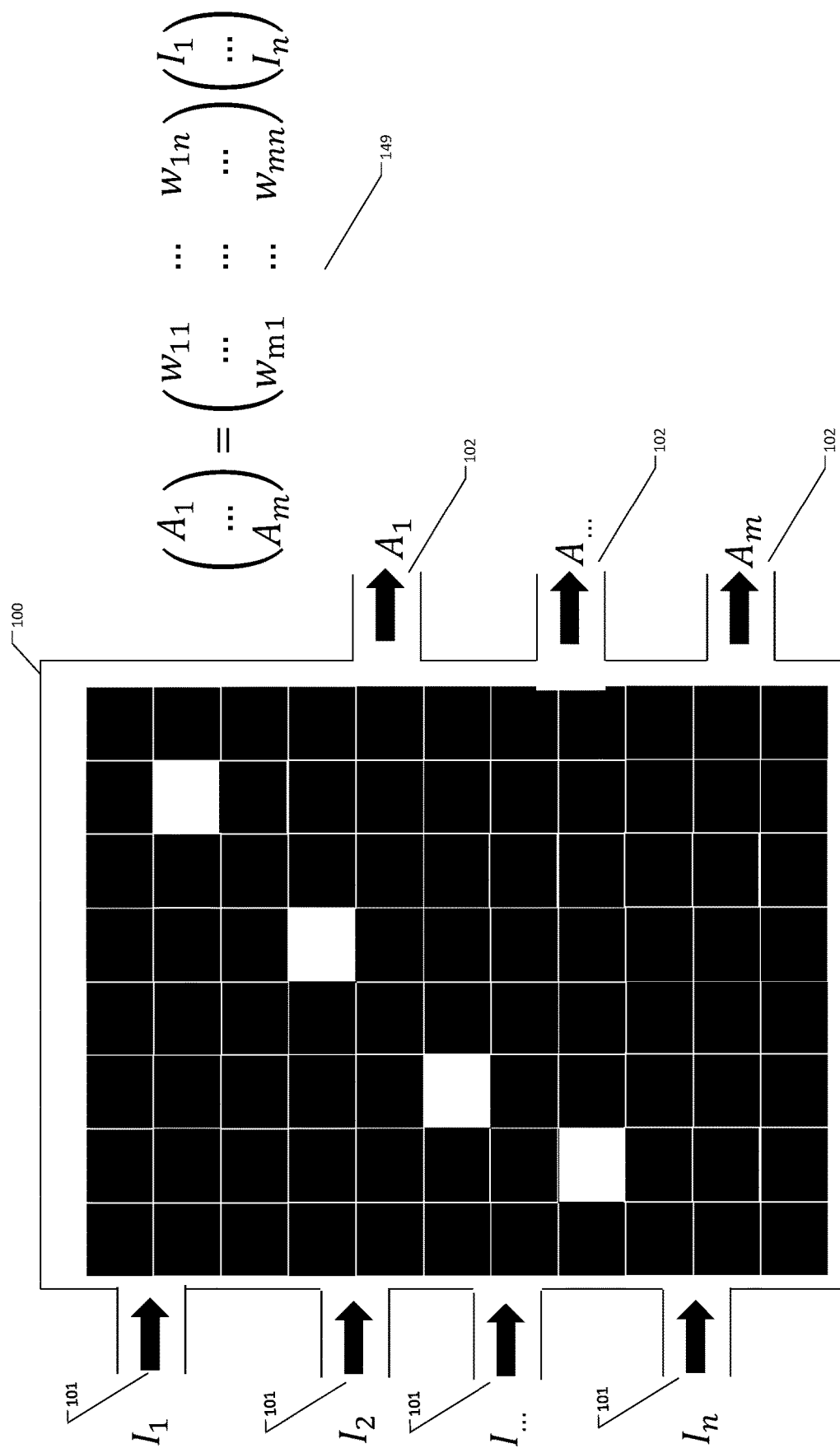

In one case shown in FIG. 19 the "desired dependency" is such that a signal $A_i$ in a given i output channel 102 approximately equals the desired linear combination of signals $I_j$ in the j input channels 101, multiplied by a certain numerical parameters $w_{ij}$, which act as "weights". Such algorithm is a "weighted sum" or, equivalently, a vector matrix multiplication 149 between the input signals and the matrix elements. It has to be noted that in many practical cases the input signals can be represented by multiple parameters each (for example, amplitude and phase) and thus the multiplication 149 has to be defined in the corresponding space of multi-dimensional (for example, imaginary) numbers.

In one possible implementation some of the input signals determine the value of at least some of the operation's parameters $w_{ij}$. In one possible implementation at least some of the matrix elements $w_{ij}$ are determined by a specific magnetization pattern ("magnetization reversal") in the magnetic element 100 and/or the values of environmental variables.

In one embodiment the output signals represent the solution of an eigenvalue and/or related eigenvector problem, with the matrix to be solved supplied either solely by or by some combination or magnetization distribution in the magnetic element 100, changes in "environmental variables" and input signals.

In one embodiment, a "desired dependency" of MPU is a combination of any of the above mentioned operations.

In one embodiment the exact nature of the algorithm performed by the MPU is determined by the parameters of some input signals 101 and/or some changes in the magnetization within the magnetic element 100. For example, the magnetization distribution ("magnetization reversal") in the magnetic element 100 can allow for multiple sets of matrix values, while the choice between them is accomplished by altering the parameters of a specific input signal and/or magnetization reversal in some specific portion of the magnetic element 100.

The case of particular importance is when vector matrix multiplication (weighted summation, FIG. 19) is combined with non-linear saturation as shown in FIG. 17 with the purpose for the MPU to function an part of Neural Network, the case which we will consider further on in greater detail.

In the most general embodiment, the time dependence of the input and/or output signals can have an arbitrary and rather complicated form. In one embodiment, the input and/or the output signal or signals represent a mixture of frequencies (for example as in FIGS. 14,15). In this case the MPU in general can perform different (and possibly simultaneous) operations on different frequency components of the input signals. In one particular case the input signals or their components (for example those corresponding to different frequencies) can be processed differently based on any combination of the following: their frequency, amplitude, phase. For example, the weights in 149 can be dependent on the frequency of the incoming signals. If the input signals contains multiple frequencies, the output signals will then also contain a mixture of matrix-vector multiplications performed separately on different frequency components, which can be further decomposed into separate frequency by utilizing the Fourier transformation MPU (FIGS. 14-15) or adding such functionality to the MPU performing matrix-vector multiplication.

Figure 20B:
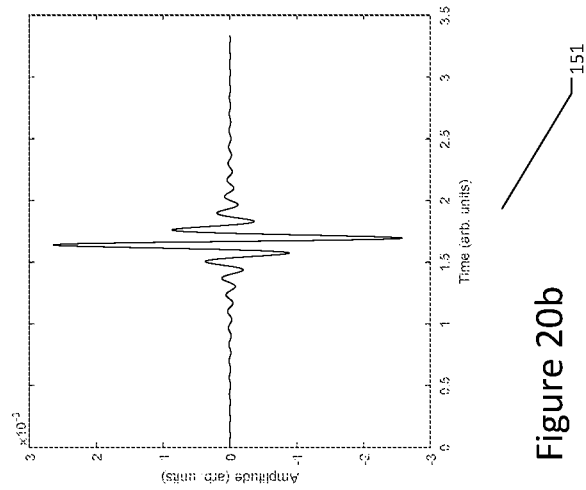
Figure 20A:
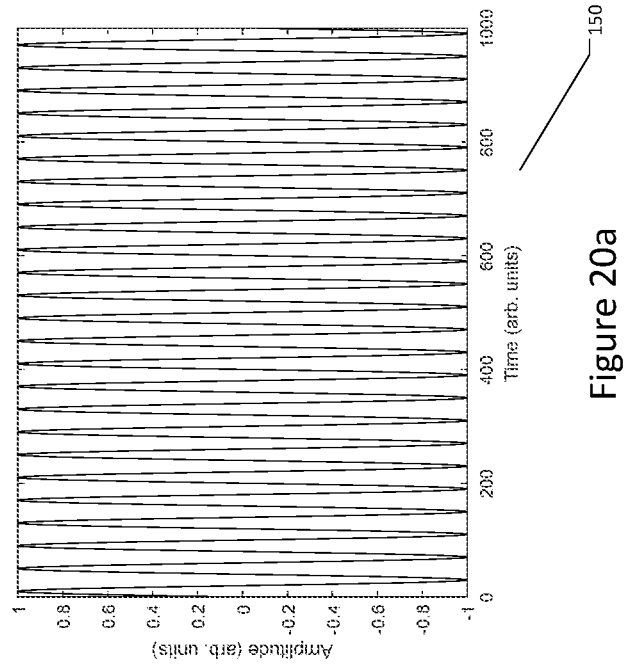
Figure 21:
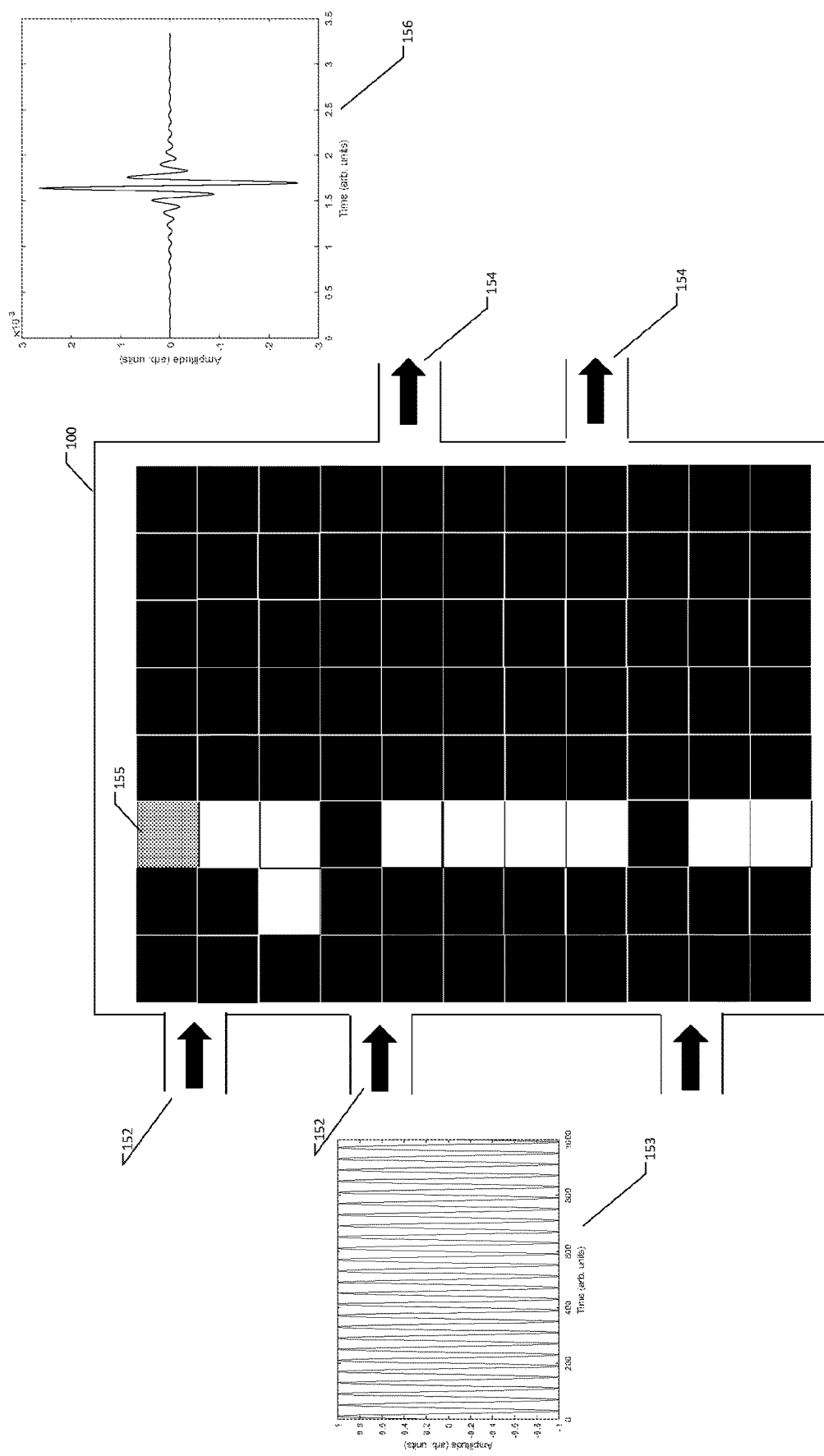

In one embodiment, the input and the output signals, or at least some portion of some of them, can be represented as "spikes" (for example, 151)—short excitations of collective magnetization precessions or equivalently—short packets of time-dependent magnetic fields. It is expected that the operations performed on the input signals will be impacted by when these "spikes" begin and end, i.e. the relative phase, in different channels. It has been established in the research literature that using spikes in some cases can offer substantial power savings per operation conducted. Unless explicitly stated otherwise, all embodiments within the scope of reference of the current disclosure can be adopted to work with the input signal of specific desired time dependence, including spikes. In one embodiment shown in FIG. 21 the input signal or channels 152 receive the input signals with a certain time, for example— as single frequency oscillations 153. In the MPU's magnetic element there are both statically magnetically reversed areas, i.e. where the magnetization distribution remains constant during the MPU's operation, except for the collective magnetic oscillations around the equilibrium, as well as some specific areas 155 where the magnetization changes significantly and possibly even undergoes the magnetization reversal during the MPU's operation. As a result the time dependence of the output signal or signals 154 is affected by the magnetization dynamics 155 and differs from that of the input signals. In a particular case the MPU can perform at least as part of its functionality conversion from a continuous wave, single (for example, as in 153 further shown in FIG. 20A) or multiple frequency signal or signals to a "spike", short wave packet (for example, as in 156 further shown in FIG. 20B).

"Desired dependence," can be associated with a metric evaluating the performance of the MPU, for example, in terms of the accuracy associated with a certain algorithm. For example, in one embodiment it can estimate how precisely the output signal or signals approximate a weighted sum of the input signal or signals with the predetermined weights. For example, a metric can be a function of the root mean square difference between the pre-determined and actual values of the weights in the linear regime of operation, and/or also reflect a metric which characterizes the transition between the liner and saturated regimes, such as threshold amplitude of a combination of the input signals that corresponds to this transition.

Modeling of the MPU's performance reveals that in a general case a pattern of the magnetization distribution ("magnetization reversal") needed for a specific operational scenario (i.e. the "desired dependence") can be very complex. When designing a system composed of multiple MPUs and/or large, complex magnetic element or elements it is often efficient to first model or experimentally measure performance (performance metric) of either isolated MPU's or a system of just a few MPUs joined together, or even performance of a specific segment or segments of MPU's magnetic element or elements and then construct the system by combining pre-designed segments (portions of magnetic element or elements, magnetic elements, MPUs, systems composed from just a few MPUs and so on) as building blocks to achieve the desired performance of the system as a whole. In this case, one can create a library of pre-existing designs or parts from which one selects those most suitable as building blocks for a more complex system designed for the specific task, possibly altering them in the process to further improve the system's performance metric.

In one embodiment the "magnetization reversal" and/or adjustment of "environmental variables", and possibly also the channel paths linking the MPUs in a multi-MPU system are at least in part obtained as a result of external computer modeling of the MPU performance. In one embodiment at least some of the adjustments needed are performed in steps. During each step after some initial adjustments (some arbitrary combination of magnetization reversal, changes in environmental variables, input signals) the output signals are being analyzed and system's performance compared to the desired dependency (desired algorithm) is being assessed. Accordingly, the adjustments made during the next step or steps will depend on how those made during the previous step or steps impacted the system's performance. As an example, the magnitude of adjustments (for example, magnitude of the external field, size and number of the areas affected by the magnetization reversal) can be changed depending on the changes in performance that resulted from previously made adjustments. Knowledge of how the system's performance responded to previous adjustments can also be used to make a selection between a few possible adjustments. For example, in one embodiment, a few combinations of "magnetization reversal" and/or changes in "environmental variables" can be tested for the purpose of determine those most suitable for the given task before the best one is selected. Ability to adjust the MPU's performance by means of the "magnetization reversal" alone and/or by changing the "environmental variables" without physically altering either materials or geometry of the MPU allows for speedy and reliable implementation and test of multiple operational scenarios.

It has to be noted that many algorithms or "desired dependencies" can be practically implemented only with relatively large error, i.e. low value of the performance metric, if the parameters of the operation (for example, matrix values in matrix-vector multiplication) are completely arbitrary. However, there can be a set of parameters for which the same operation can be implemented with a much better precision. Therefore, in one embodiment the system including one or multiple MPUs is assembled from interconnected blocks, at least some of which are specifically designed to operate with only a specific set of parameters, but with high performance metric.

Figure 22:
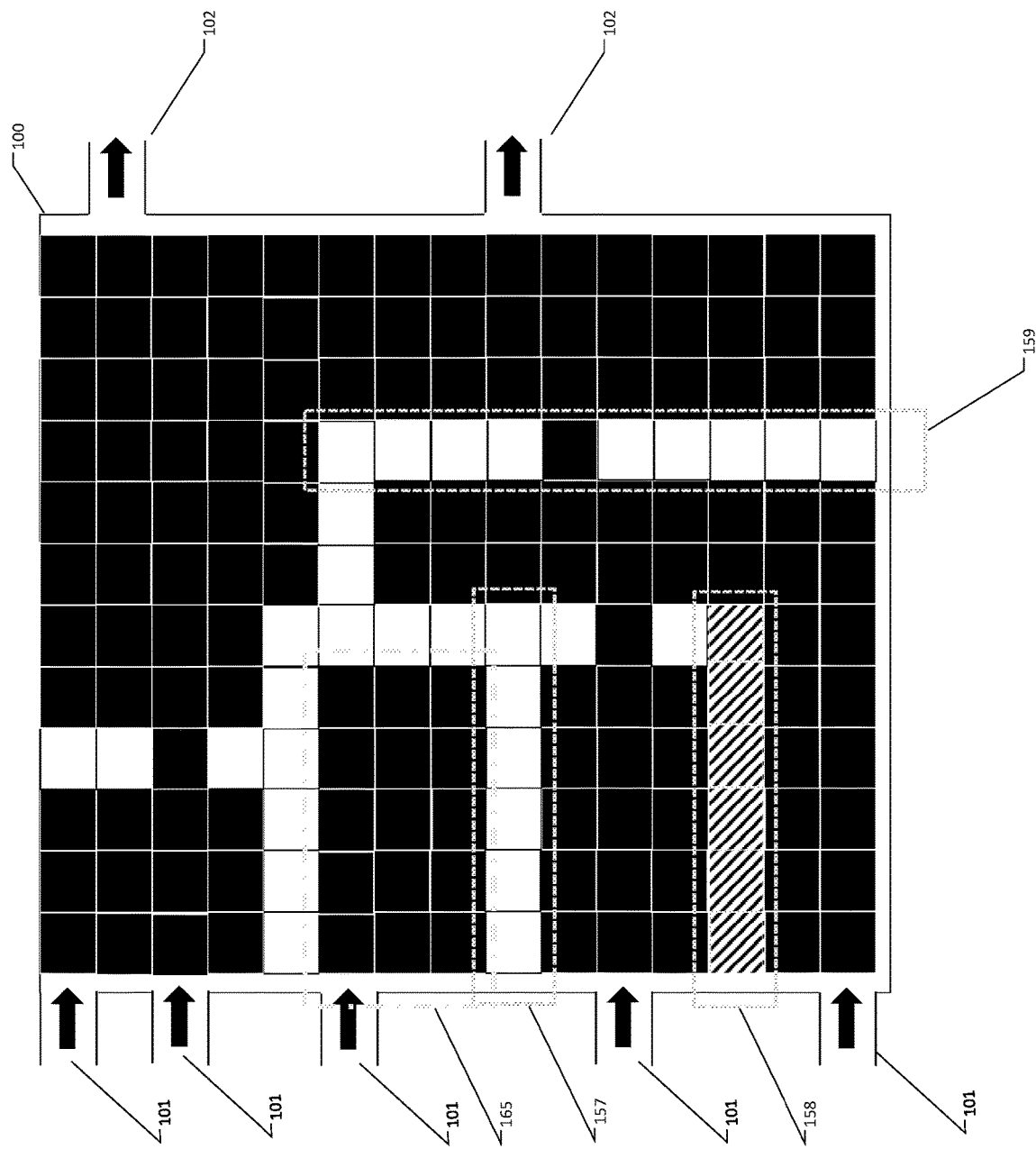
Figure 24:
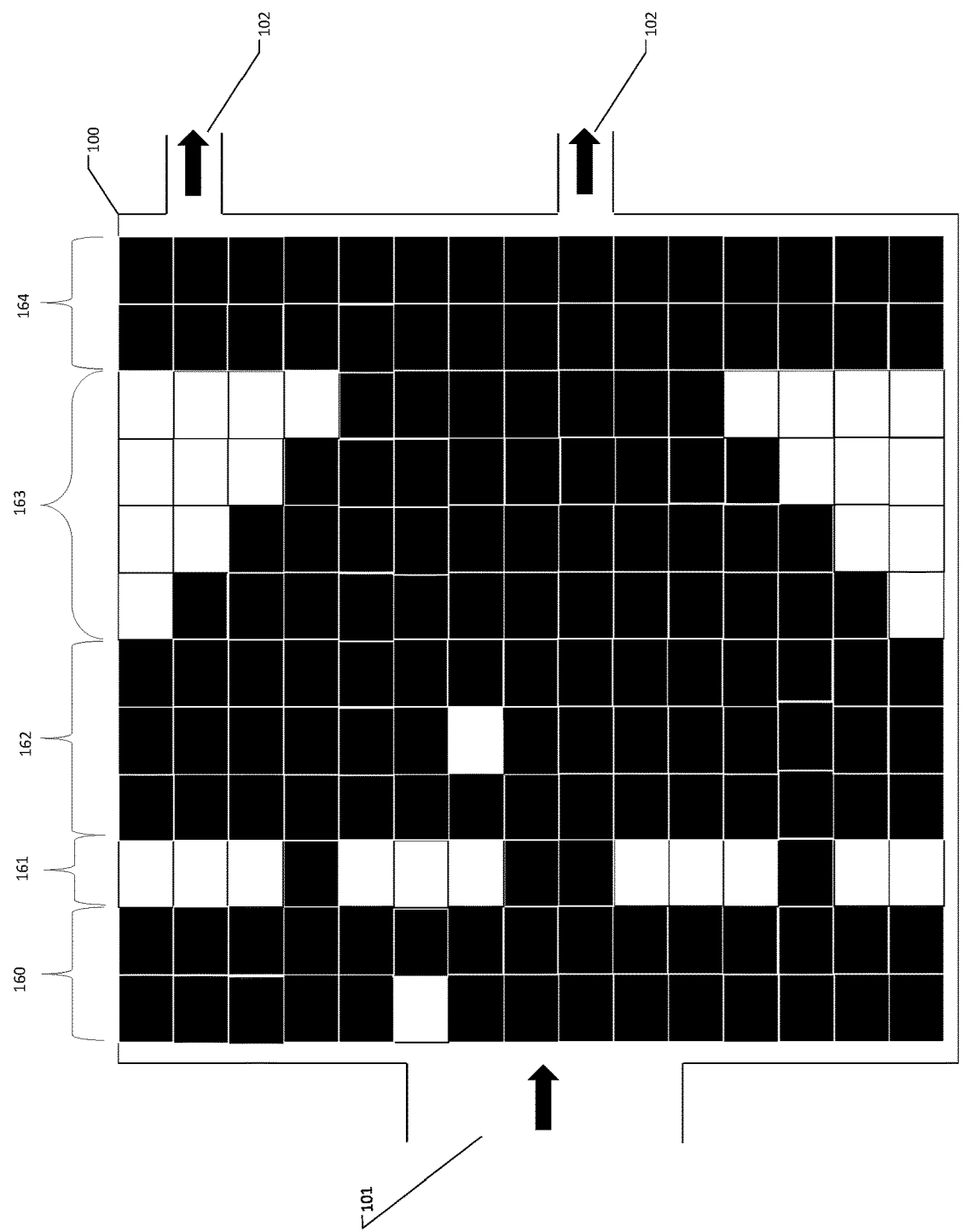

While in the most general case the pattern of "magnetization reversal" can be rather complex, there are a few particular example cases disclosed below. The purpose of such embodiments as shown in FIGS. 22 and 24 is largely to "separate" functionally different areas within a single magnetic element. Such separation can be accomplished by a magnetization reversal of a segment between the areas with different functionality 157, 159. It can be in addition or instead be accomplished by alteration of physical properties 158 between these areas. Possible examples include altering magnetic properties of magnetic materials, or removing magnetic materials 158 altogether. The "separations" can reduce the mutual interaction between the areas, including but not limited dipole-dipole and exchange interactions. In one embodiment the separation 157, 158 occurs between the magnetic areas whose functionality is predominantly related to specific input and/or output channels 101, 102; such separation implementation often involves affecting the areas in direct proximity to the input and/or output channels. In one embodiment the separation occurs between the areas performing different operations on the same or different set of input signals. In one embodiment the separation 159, 161 occurs between the areas corresponding to different "layers" of processing, i.e. consecutive operations on the results obtained from the earlier "layers". The areas used for separations can also have other functionality, for example, but not limited to, performing non-linear saturation, amplifying or damping down the signal and so on. A particular example is shown in 163, which funnels the signal towards a smaller area, with the expected change in signal's amplitude.

One aspect of the present disclosure is that it allows for effectively changing the amplitudes and/or phases of the input signals without requiring a modification of the external source of such signals. Indeed, such adjustment can be represented as an additional vector-matrix multiplication as shown in FIG. 23, in which in addition to the matrix elements $w_{ij}$ (FIG. 19) which define the multiplication operation that one wants to perform via the MPU, there is an additional matrix multiplication shown in FIG. 23 by which parameters characterizing a single channel signal $I_0$, a select few input channels, are multiplied by the matrix $q_j$ which represents the desired adjustment of the input signals' parameters (for example, their amplitudes and phases). In one embodiment this multiplication is simply incorporated as part of the matrix (FIG. 19) associated with the operation performed by the entire MPU or its part. In one embodiment FIGS. 22, 24 the adjustment of amplitudes associated with input and/or output signal or signals can be performed in a specific area, for example 160, within the MPU's magnetic element. In one embodiment it is performed in the area (for example, 165) directly adjacent to a specific channel, and separated by magnetization reversal 157 or other means from those adjacent to other channels. In one embodiment this functionality is delegated to a specific portion of the MPU, for example 160 (for the input signals), preceding, or 164 (for the output signals), succeeding the rest of operations performed by the magnetic element 100 of the MPU, and possibly separated by magnetization reversal 161 or other means from the areas responsible for the rest of MPU's functionality. Adjustment of the parameters associated with specific signals can involve magnetization reversal in the corresponding areas, and/or local changes of the environmental variables, and/or changes in local physical properties of magnetic materials. In the most general embodiment besides the amplitudes, other properties of the input signals, such as, but not limited to, as phase, frequency, duration, can also be adjusted within the MPU's magnetic element 100. In one embodiment since the parameters of the input signals need to be updated far more frequent than the parameters associated with the MPU's core algorithm, the optional element responsible for the magnetization reversal in the corresponding areas (for example, 160 or 165), where the parameters of the input signals are being adjusted, is a separate device, while magnetization reversal and/or adjustment of environmental variables in the rest of MPU's magnetic element is done by a different device. One of the possibilities is that a faster, random access method of magnetization reversal, such as via spin transfer torque (STRAM, FIG. 9) or wires 117 integrated with the MPU's magnetic element 100 are being used to update the input signals' parameters with a sufficient speed.

Compared to the case where the amplitude of the input signals is actually varied by that of the external source of the time dependent magnetic field, adjusting it within the MPU allows for a number of simplified implementations, where at least some of the input channels connected to at least some of the MPUs receive the time dependent magnetic field or equivalently collective magnetic oscillations from such common sources as single or multiple STOs, or phase locked array or arrays of STOs, wire or wires conducting the AC current or a semiconductor electro-magnetic field generator, without any substantial differentiation between them. An example shown in FIG. 24 demonstrates a possible particular embodiment, where the input signal is applied to the area 160, within which the magnetic element 100 by means of the magnetization reversal and/or adjustment of environmental variables the input signals' amplitudes and possibly phases are being adjusted, followed by magnetic separation 161 which preserves the separate functionality of the area 160 and allows for its magnetization to be updated without affecting the algorithm performed in the next section 162, the one responsible for the MPU's core computing functionality. It is followed by optional sections 163 and 164 which manage the amplitude level of the output signal (for example, by using "funneled" magnetization pattern as in FIG. 24, or some other magnetization pattern) and perform the final operations (for example, non-linear saturation as a function of output amplitude and/or the redirection between the output channels 102) on the signal before it reaches the output channels 102.

In the most general embodiment there can be input channel or channels linked to an MPU, with the parameters of corresponding input signals adjusted within the MPU's magnetic element 100, while there can also be input channel or channels whose signals are adjusted externally to the MPU's magnetic element, and also potentially input channel or channels whose signals are adjusted both externally and within the MPU's magnetic element.

In one particular embodiment the magnetic material within a single MPU's element has more or less uniform magnetic properties, aside from expected and largely unavoidable variations, such as, for example, those associated with different individual dots and/or grains. In one particular embodiment a single MPU's magnetic element is composed from a magnetic material or materials with varied properties. In one particular embodiment a single MPU's magnetic element has spatially non-uniform magnetic properties, and/or non-uniform values of the "environmental variables". This can include variations of physical properties intended to either reduce the coupling between the sections of MPU corresponding to different functionality, achieve different functionality in different portions of MPU, or other. In one particular embodiment the exchange interaction and/or anisotropy parameters, and/or saturation magnetization are altered in some portions of the magnetic element with respect to others. This substantially affects the spectrum of resonant collective magnetic oscillations and can have an extensive impact on MPU's functionality. For example, when a section performing vector-matrix multiplication is followed by a section responsible for non-linear saturation, the latter can have different anisotropy constant or has external magnetic field applied, with the intention to affect the threshold amplitude at which the system switches between the "linear" and "non-linear saturation" regimes.

In one embodiment different MPUs or different structures of a single MPU's reside predominantly in the same plane.

Figure 25:
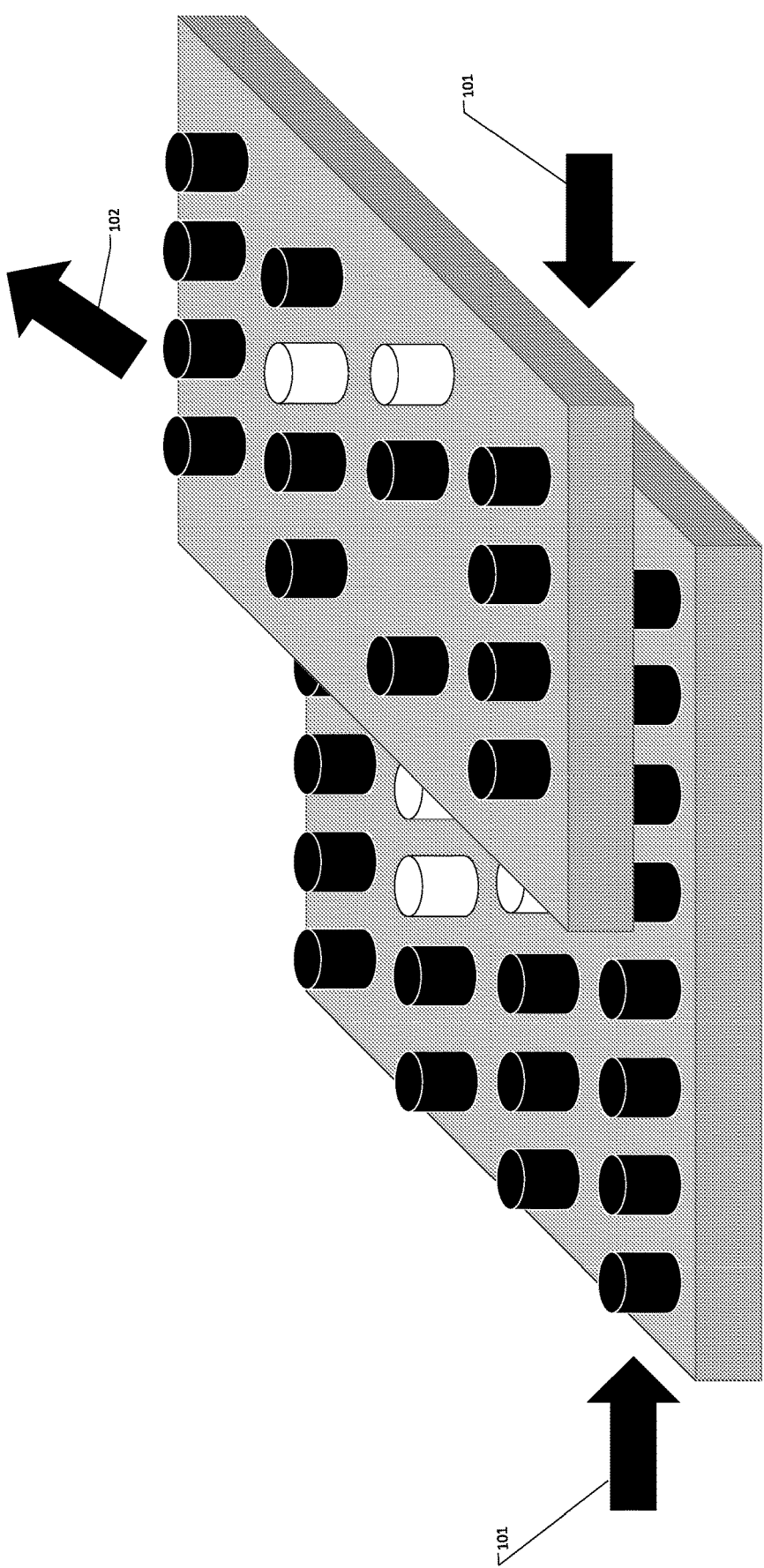
FIG. 25 illustrates an example three dimensional structure for the MPU.

In one embodiment different MPUs or different layers that are part of a single MPU form three dimensional structure, as for example shown in FIG. 25. In one embodiment all of these layers are composed of magnetic materials. In one embodiment some of these layers are composed of magnetic materials, while others are non-magnetic, for example, containing coil leads, air gaps, and so on.

So far we considered mostly the aspects related to design of a single MPU, however it is likely that many practical systems will contain either multiple interconnected MPUs or one MPU with similarly complex, multi-segmented magnetic element.

Figure 26:
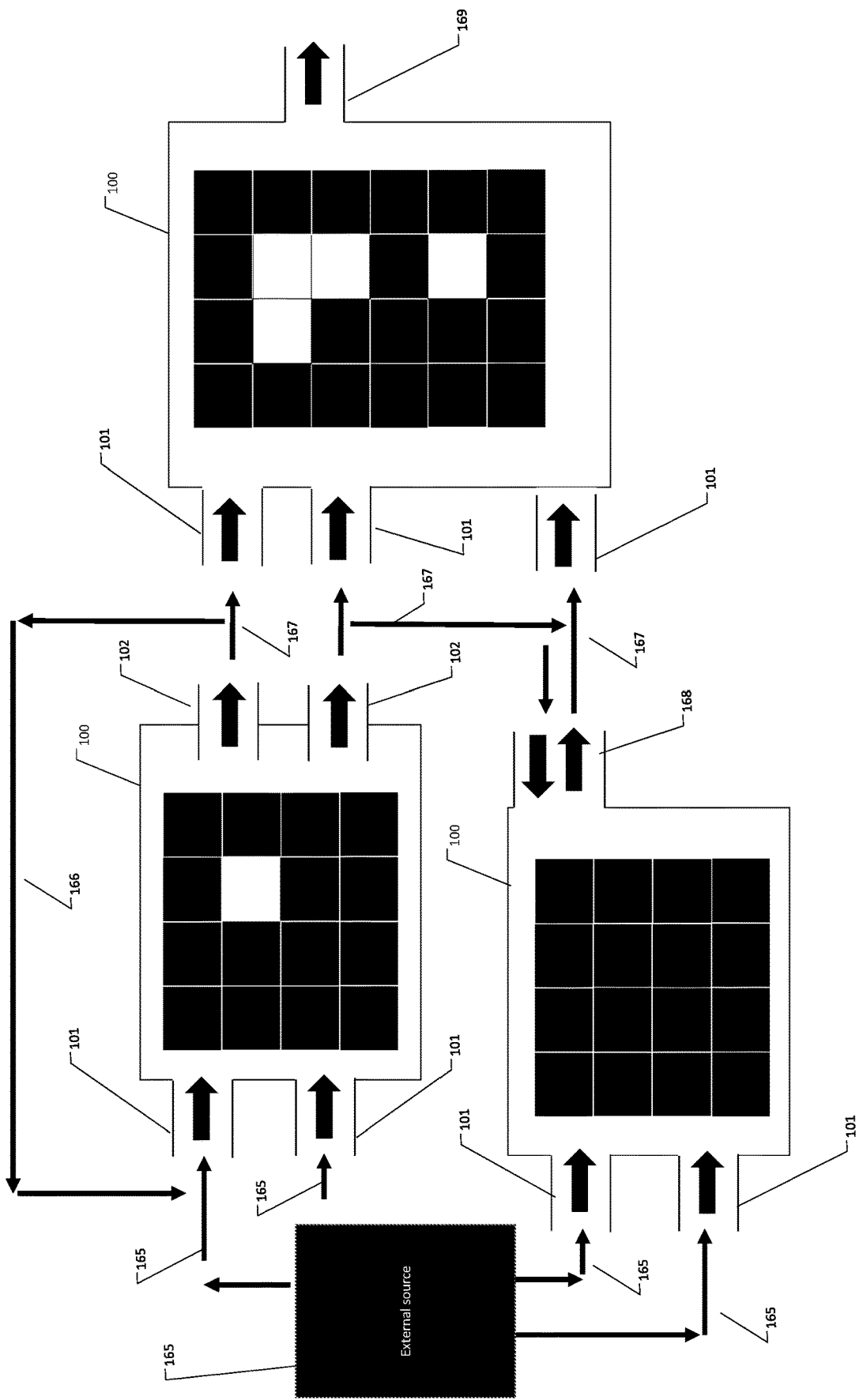
FIGS. 26-33 illustrate variations of MPU arrangements.

In one embodiment such as shown in FIG. 26 one or more MPUs comprise a system where the input for of at least some of the MPUs is provided by the external source 165. Such input can be any combination of collective magnetic oscillations, magnetic fields, alteration of environmental variables, alteration of magnetization in one or multiple magnetic elements 100. Examples were already considered in multiple embodiments within this disclosure.

In one embodiment all input 101 and output channels 102 are separate elements, in another possible embodiment at least some of the input and output channels perform both functions 168, i.e. both input and output the signals to and from at least one MPU. In one embodiment the output signal of the system from some output channel can also supply (directly or after some additional processing) 167 the input signal to some MPU, including the case 166 where the output signal from one MPU serves as the input signal for the same MPU. The connections 166, 167 linking the input and/or output channels of MPUs or transferring the information between magnetic elements of the same MPU can have different physical implementation. In one embodiment, they can be formed from a magnetic material and the information between the channels is exchanged through collective magnetic oscillations. There are embodiments where the signals are being transmitted directly through magnetic fields generated by the magnetic elements, through electrical currents, through optical radiation and others. In one embodiment shown in FIG. 27 the signal taken 170 from MPUs and/or external source of information is converted to some other form and/or processed by an external device 171 before being transferred 172 to other and/or the same MPUs or delivered to some outside system. For example, in one possible embodiment the signals 172 for the output channels exist as collective magnetic oscillations, which are being converted to electrical currents, processed by the external processing device 171 and delivered to some MPUs. As all input and/or output signals, the signals 172 can exist in a variety of forms, including collective magnetic oscillations, magnetic fields, optical radiation, electrical currents (for example, such as employed for the purpose of switching some spin torque operated elements inside the MPUs' magnetic elements or activating magnetic write head like device which alters the magnetization within the magnetic elements). Aspects stated with respect to the input and/or output channels and signals of individual MPUs 101, 102, 166, 167, 170, 172 and others, unless explicitly stated otherwise, can be applicable to both the input 165 and/or output 169 signals and corresponding channels of a system composed of multiple MPUs.

While in the Figures the input 101 and output 102 channels are generally shown located along the outer sides of the magnetic elements 100, this is an abstraction made for the sake of convenience and does not preclude other implementations. In one embodiment at least some of the input and/or output channels are connected to some arbitrary location within the magnetic element. In one embodiment, at least some of the input and/or output channels are not physically connected to the magnetic element, but instead receive or supply the information remotely. For example, it can be implemented by measuring and/or changing the magnetic field applied to or generated by the MPU's magnetic element 100.

In one particular embodiment at least some of the MPUs and their magnetic elements can be a part of a single, possibly multi-layered, structure.

In one embodiment there are certain features implemented to limit the unwanted mutual interaction of different MPUs is at least somewhat independent from each other, with an understanding that in general case there will be at least some mutual influence, for example, due to magnetic fields generated by the MPUs' magnetic elements. Such features can be similar to the embodiments previously discussed for the purpose of separating the functionality of different portions of a magnetic element, including, but not limited to, some combination of changes in magnetization, material properties and environmental variables. There can be similar or other features dedicated to ensure the functionality of the input and/or output channels. For example, the embodiment such as the structure in FIG. 22 can be interpreted as multiple MPUs that are exchanging information through channels formed by the magnetization reversal 159 and/or, possibly, physical removal of magnetic material 158.

Regarding the overall shape of magnetic element or elements of a single MPU, or a shape of a system composed from multiple MPUs, there are no particular limitations. Among the Figures presented in the current disclosure a rectangular shape of a magnetic element 100 predominates, with the thickness smaller than either its width or length, however this is an abstraction made for the sake of convenience and does not preclude the implementations that are differently shaped.

In one possible embodiment the shape of a single MPU has the input channels arranged predominantly along one side, the output channels arranged predominantly along some other side, and the dimensions of the said sides are chosen so that to accommodate the expected ratio between the input versus the output channels, or the ratio of amplitudes of input versus the output signals. Such difference in dimensions in this particular embodiment can correspond to "fan out" or "fan in" regimes, i.e. rather typical situations when either the number of output channels significantly exceeds the number of the input channels ("fan out") or the number of input channels significantly exceeds that of the output channels ("fan in"). In one possible embodiment when multiple MPUs 173 or magnetic elements of a single MPU are combined, they are shaped and/or stacked in such a way FIG. 28 that there is an overall funneling effect, which reflects whether the system of the particular segment of a larger system operates in a "fan in" or "fan out" regime, the particular shape chosen reflecting the discrepancy between the numbers and/or the signal power in the input 101, 174 and output 174, 102 channels entering a typical MPU (some channels 174 can play the role of input for some MPUs and output for others). In one possible embodiment the overall shape of the system composed from a combination of multiple MPUs and/or multiple magnetic elements resembles a "pizza slice" or conical profile, such as with the MPUs arranged in a step-like formation FIG. 28. In one possible embodiment FIG. 29 the overall shape of the system composed of multiple or single MPUs, multiple or single magnetic elements, is either oval or a spherical like object, with the outer surface accommodating the input and/or output channels 175, while the inner portion of the system is connected to another set of the input and/or output channels 176. This configuration is expected to offer substantial benefits in the case when the processing by the magnetic element or elements is associated with both a significant changes in power (for example, power loss incurred during the propagation through a magnetic element) and a significant discrepancy between the numbers of the input and the output channels. In one particular embodiment the input channels 175 provide the power and the signals which are then flowing towards a smaller number of the system's output channels 176, which output the information to the external recipient, which can be another MPU system.

Figure 28:
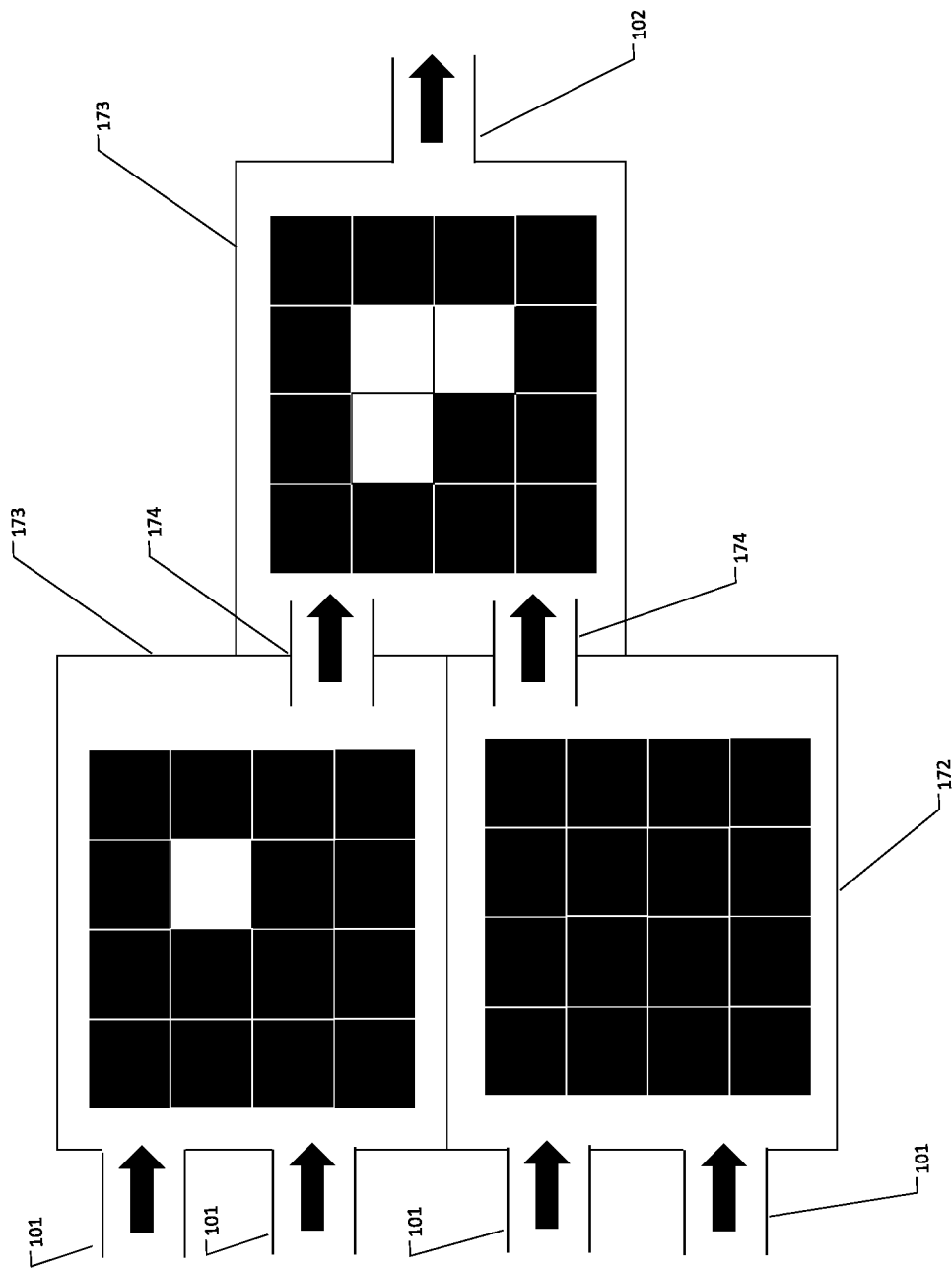
Figure 29:
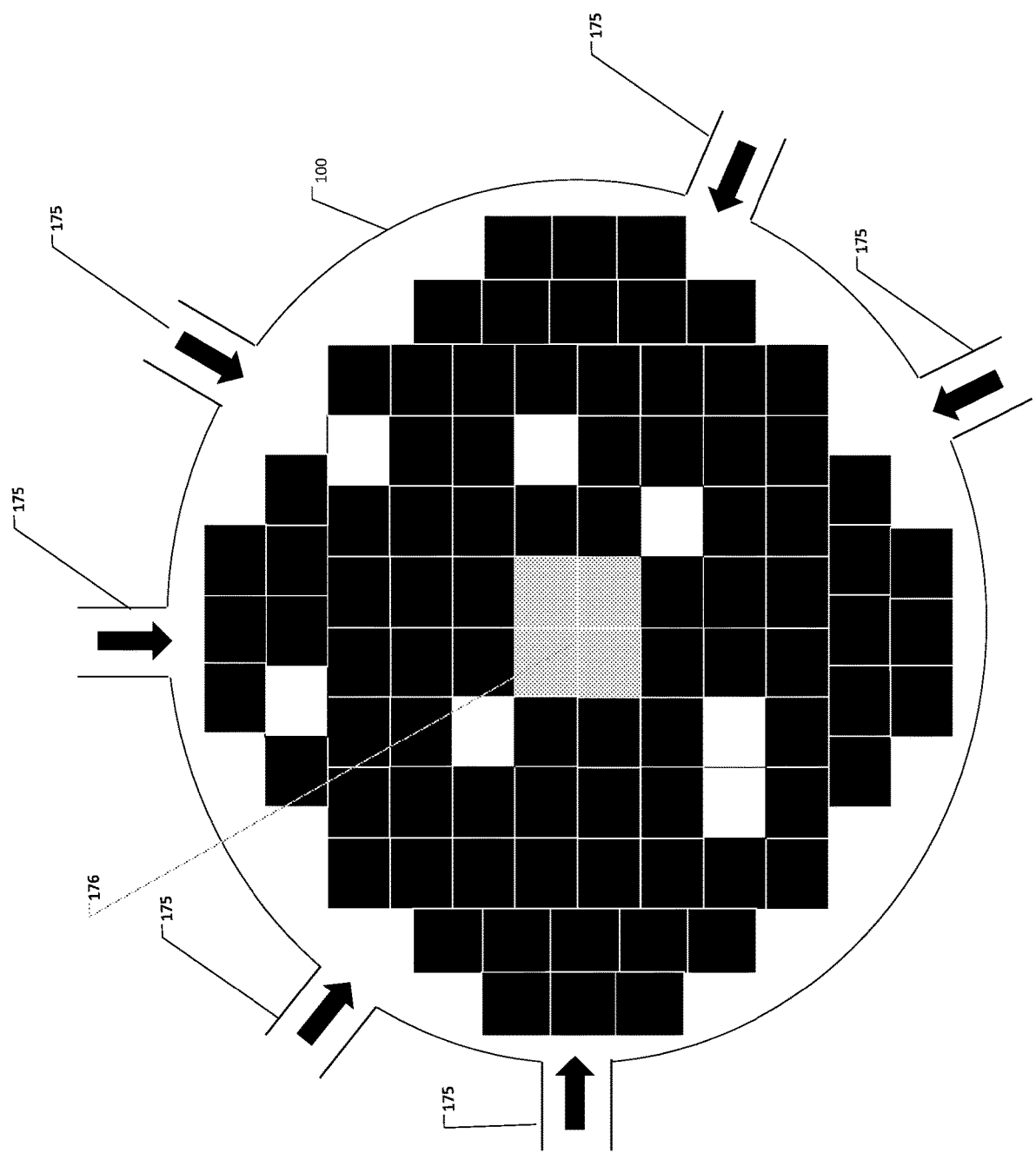

In one possible embodiment the shape of a single MPU has the input channels arranged predominantly along one side, the output channels arranged predominantly along some other side, and the dimensions of the said sides are chosen so that to accommodate the expected ratio between the input versus the output channels, or the ratio of amplitudes of input versus the output signals. Such difference in dimensions in this particular embodiment can correspond to "fan out" or "fan in" regimes, i.e. rather typical situations when either the number of output channels significantly exceeds the number of the input channels ("fan out") or the number of input channels significantly exceeds that of the output channels ("fan in"). In one possible embodiment when multiple MPUs 173 or magnetic elements of a single MPU are combined, they are shaped and/or stacked in such a way FIG. 28 that there is an overall funneling effect, which reflects whether the system of the particular segment of a larger system operates in a "fan in" or "fan out" regime, the particular shape chosen reflecting the discrepancy between the numbers and/or the signal power in the input 101, 174 and output 174, 102 channels entering a typical MPU (some channels 174 can play the role of input for some MPUs and output for others). In one possible embodiment the overall shape of the system composed from a combination of multiple MPUs and/or multiple magnetic elements resembles a "pizza slice" or conical profile, such as with the MPUs arranged in a step-like formation as shown in FIG. 28. In one possible embodiment shown in FIG. 29 the overall shape of the system composed of multiple or single MPUs, multiple or single magnetic elements, is either oval or a spherical like object, with the outer surface accommodating the input and/or output channels 175, while the inner portion of the system is connected to another set of the input and/or output channels 176. It has to be noted that in an alternative implementation the shape of the MPU or the system composed on multiple MPUs is arbitrary, however the relative location (configuration) of the input and output channels resembles the "pizza slice", conical, radial FIG. 29 or other profile. The shape of the magnetic element or elements does not have to be conformal with respect to the said configuration of the input and output channels. Configurations such as shown in FIG. 29 are expected to offer substantial benefits in the case when the processing by the magnetic element or elements is associated with both a significant changes in power (for example, power loss incurred during the propagation through a magnetic element) and a significant discrepancy between the numbers of the input and the output channels. They also can help to control the relative difference in phase incurred by signals propagating from different input channels. In one particular embodiment the input channels 175 provide the power and the signals which are then flowing towards a smaller number of the system's output channels 176, which output the information to the external recipient, which can be another MPU system.

Figure 30:
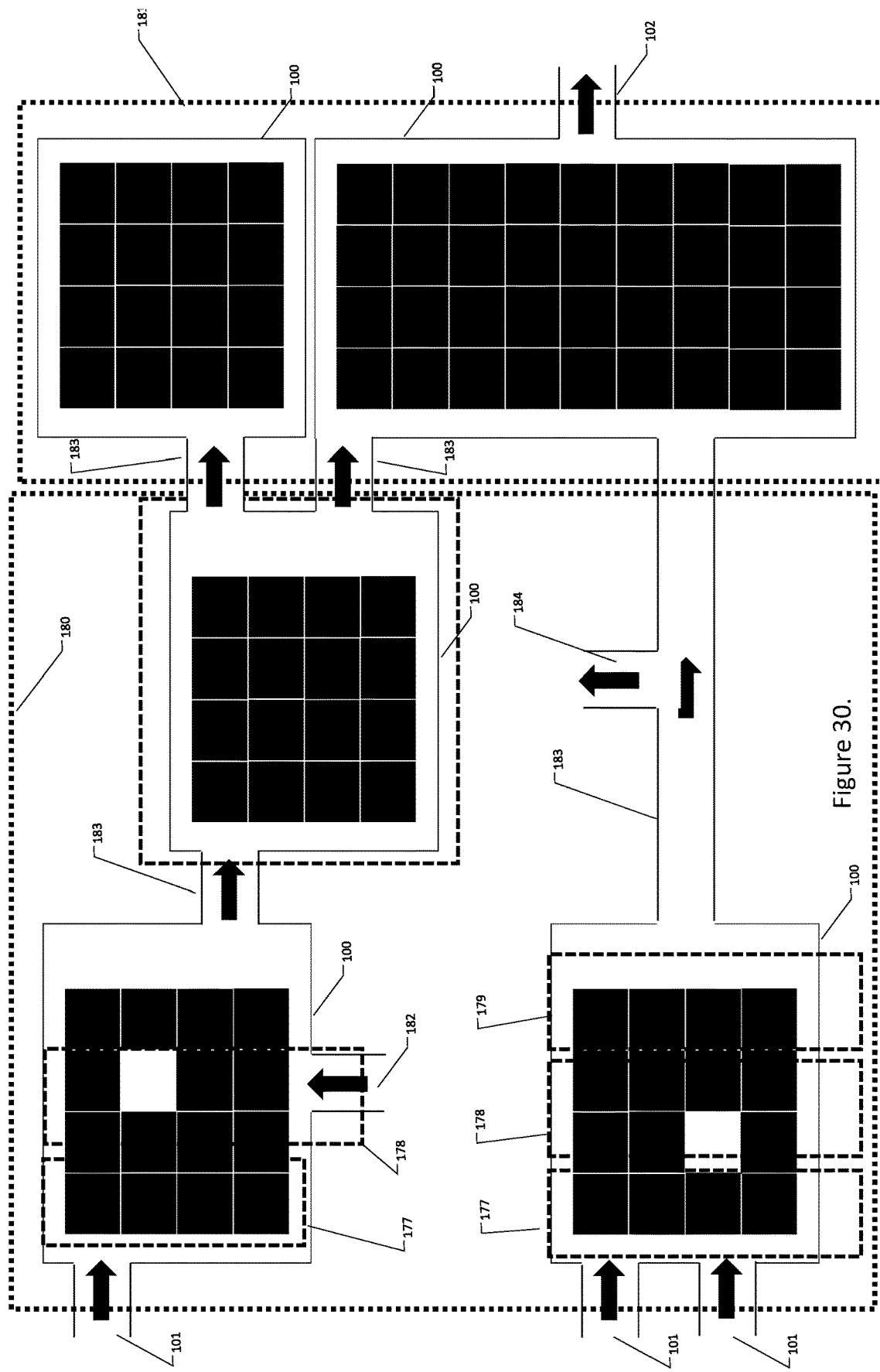

One particular implementation of a system composed of multiple MPUs and/or magnetic element is a Neural Network shown in FIG. 30. It has a number of computational blocks or units, at least some of which, or some particular combination of which is capable of performing at least a weighted summation of the signals it receives (which in some implementations can be described as a multiplication between a supplied input vector and internally stored matrix). In addition, in most practical implementations the Neural Network will contain a number of computational blocks or units, at least some of which, or some particular combination of which is capable of other algorithms, possibly in addition to performing the "weighted summation". A common example of such additional algorithm is "non-linear saturation", i.e. outputting the obtained sum in different regimes which includes a linear regime, in which the output signal increases more or less linearly with the amplitude of the incoming signals, and a saturated regime, which activates for large amplitudes of the input signal or signals, and in which the output signal's amplitude exhibits substantially weaker dependence between the input and output signals' amplitudes, compared to the linear regime. Related functionality for a single MPU was already considered earlier in the present disclosure in conjunction with FIG. 24. In the most general case, within Neural Network the algorithms, including but not limited to weighted summation, non-linear saturation and possibly other do not have to be each performed by a single magnetic element or single MPU. For example, in FIG. 30 we can have a segment of magnetic element where magnetization adjusts the parameters that correspond to the input signals 177, a segment which performs vector-matrix multiplication 178 and a segment which performs the non-linear saturation 179. Each of these segments can be entire or part of a magnetic element and/or an MPU as shown in FIG. 30. In some MPU these operations can be performed simultaneously by the same magnetic element, while in other cases they can be performed sequentially either by different magnetic elements or by different MPUs. The segment 177 due to its functionality is expected to be more common in the MPUs located close to the input channels connecting the Neural Network to the external sources of data. In the general case, the functionality of segments 177, 178, 179 can be augmented by MPUs or portions of MPUs performing logical operations, Fourier transform, power management (which we will consider further in the current disclosure) and/or other functions. In Neural Network certain combinations of such segments, and/or of individual magnetic elements and/or of individual MPUs can form distinctive signal processing 180, 181, with the information from a previous layer 180 being fed predominantly to the next layer 181. All embodiments within the scope of the current disclosure are applicable to Neural Networks, which in itself is a particular case of a system composed of multiple MPUs and/or multiple magnetic elements 100. This includes the connections 183 between the magnetic elements, the channels inputting information to the system 101 and those outputting it from the system 102. It is expected that in some embodiments there will be input channel or channels 182 connecting the magnetic elements to the external system, such us, but not limited to, as those that update the weights (matrix parameters) for the weighted summation (vector-matrix multiplication), and/or parameters of the input signals. In some embodiments this can be accomplished by magnetization reversal in magnetic elements, in accordance to the relevant embodiments considered within the current disclosure. Similarly, there can be output channels 184 which output to some external system the information from individual processing layers 180, 181 and/or magnetic elements 100, for example, for the purpose of evaluating the algorithms' performance and consequent adjustment of weights and other parameters related to MPUs functionality. A potential feature of Neural Network via MPU technology is that the signal processing direction can be reversed, i.e. as the result of such the output channels 102 will be providing an input signal for the system, while the input channels 101 will provide the output for some external evaluation. In one embodiment this reversal will be accompanied by adjustment of magnetization and/or environmental variables within the Neural Network's magnetic elements to accommodate the backward propagation. Such reversal of processing direction can be potentially employed for a more efficient evaluation of the performance associated with the existing combination of weights and/or input signals, for the given desired result.

One consideration, is that for any implementation of input and/or output channels, such as, but not limited to channels 101, 102, 154, 167, 168, 170, 172, 173, 174, 175, 176, 182, and 183, their parameters can be potentially dynamically adjusted during, before or after the MPUs operation, whether as part of a Neural Network implementation, or as part of a more general computing system which includes one or multiple MPUs. Such adjustment in one embodiment involves changes in the magnetization and/or environmental variables, for example, those affecting the propagation of collective magnetic oscillation in the specific channels. In case when such channels are formed at least in part by magnetization reversal patterns, as per the embodiments demonstrated in FIGS. 22 and 24, the magnetization reversal, possibly in combination with changes in environmental variables, can actually not only change the amplitude, phase or other properties associated with the signals conducted by the given channel or channels, but to destroy and to or create the channels, rerouting how the information flows within the system. This has a particular value for complex processing systems, including Neural Networks, where the layout of processing, including which MPUs are being provided with which information, might need substantial adjustment depending on how well the algorithms performs, possibly with respect to some pre-determined test data.

Since at least some of the magnetization inside a typical magnetic element 100 is expected to be stabilized by anisotropy, and possibly also external magnetic field and/or other environmental variables, it can potentially act as a nonvolatile memory. As an example, it can store the values of weights in a weighted sum. More generally, this type of functionality can involve storing results of computations performed by magnetic element or elements 100, value of parameters related to algorithms performed by the MPU or MPUs 100, and so on. Such option for non-volatile storage directly combined with processing within the same device offers multiple advantages compared to the systems where processing and memory are separate devices that rely on different physical principles for their functionality.

A consideration for a single MPU, and especially for the systems composed of many MPUs or having magnetic element or a combination of magnetic elements of considerable size is power losses, i.e. the power and/or amplitude of the output signals compared to that of the input signals. A power amplification apparatus is an optional element of potentially substantial importance. The main difficulty in implementing such is maintaining a controlled relationship between the phase of collective magnetic oscillations that need to be amplified inside the MPU and the phase of the external source of power.

Figure 31:
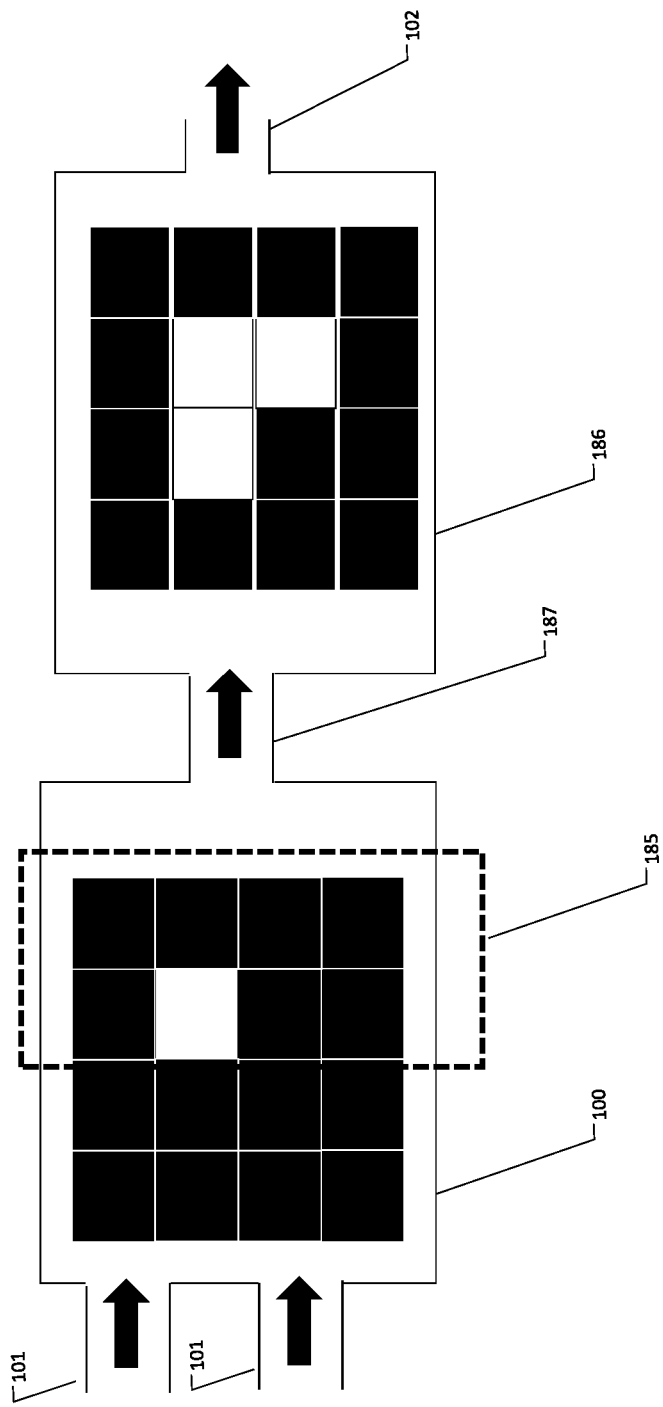

In one embodiment shown FIG. 31, the power amplification becomes either a function of a specific portion of an MPU 185 or a dedicated magnetic element and/or MPU 186. It can be shown that for certain magnetization distributions and/or values of environmental variables in magnetic elements 185, 186 it is possible to achieve in the output channel 102 the powers that are considerably higher than those in the input channel or channels 101, 187. It is especially relevant, but not exclusive, to the case when the signal supplied by the input channel or channels 101 has a continuous wave form (with single or multiple frequencies). Such power accumulation can come at expense of the maximum processing speed, as the necessarily power needs time to build up inside such an amplification element 185, 186. As with other types of functionality of a magnetic element or elements in the current disclosure it is difficult to provide an exact definition of a magnetization distribution that leads to such an effect (power amplification), as a particular implementation will depend on the element's size, magnetic properties and so on.

Figure 27:
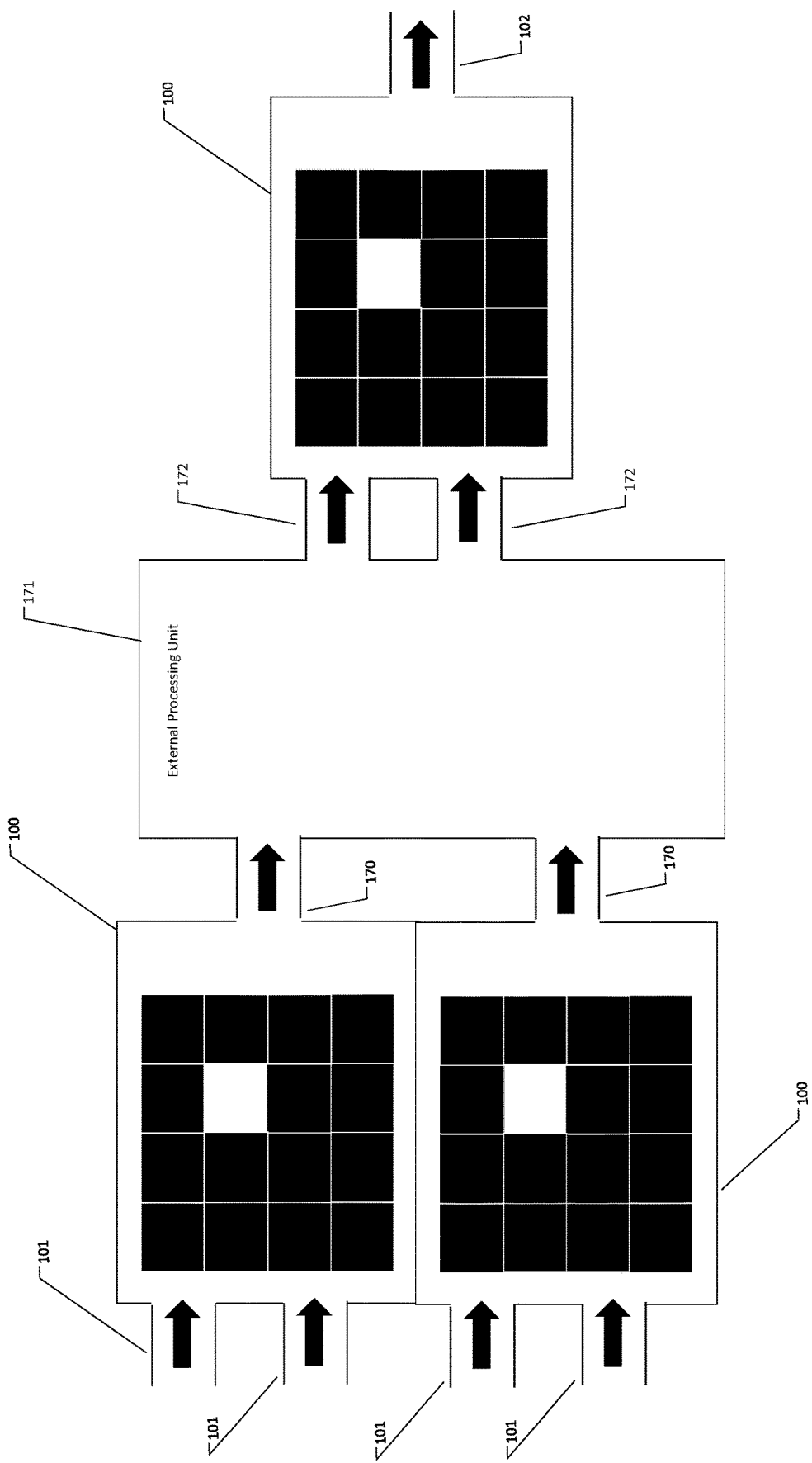

In one embodiment as shown in FIG. 27 the power amplification is performed at least in part by an external element 171, which can receive the signals 170 from one or multiple MPUs, possibly convert them to some other form, which is more suitable for power amplification, amplify them, and if needed, convert them back to collective magnetic oscillations and/or fields, and finally delivers the amplified signal 172 to some set of MPUs. It is possible that the external element 171 also performs other forms of processing of the signals 170. In one embodiment the external element 171 does not receive a signal from one or more MPUs 170, but instead simply feeds the signal (power) 172 to some MPUs. This power can be supplied in multiple forms, including but not limited to collective magnetic oscillations or excitations of such by means of spin torque, optical radiation or other, oscillating magnetic fields, and so on.

Figure 32:
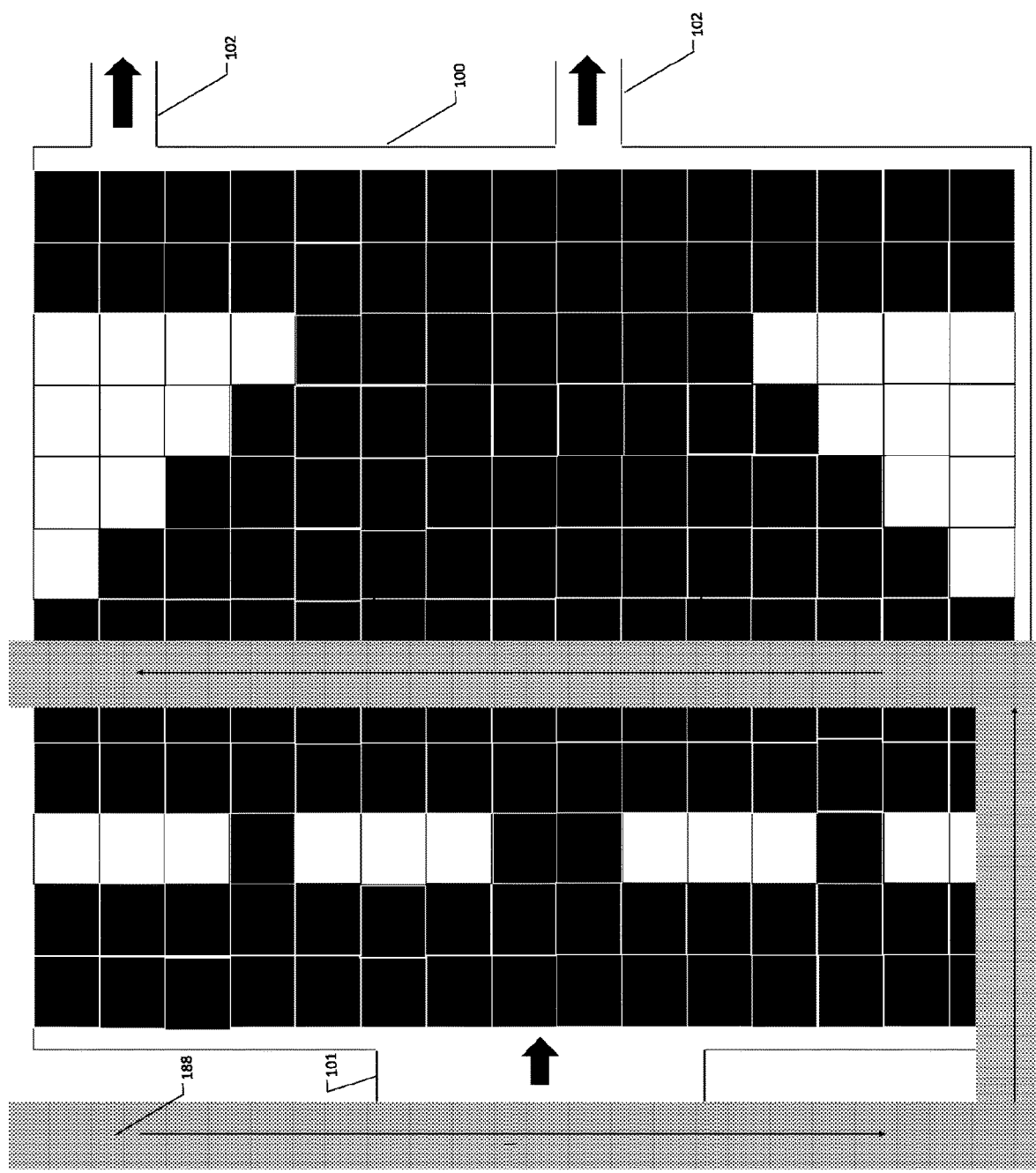

Such general method has particular implementations that can be of importance. In one embodiment, we utilize the ability of adjusting the parameters related to the input signal by means of magnetization and/or alteration of the environmental variables within the magnetic element or elements. The input channels 101 (as, for example in FIG. 24) in such a case can be tasked with supplying a power rather than the input information per se. Such channels can be routed to an arbitrary MPU and/or location within its magnetic element or elements. In one embodiment the magnetic element or elements are designed to maintain a specific phase of collective magnetic oscillations at least in some portion of them. In this case as shown in FIG. 32, the power can be supplied by even a single generator of oscillating current, attached to a single wire or a set of interconnected wires 188 that approach the magnetic element or elements 100 in specific locations and provides the necessary power input to the system, while the system's design ensures that this power has a fixed phase relationship with the internal magnetic oscillations. In a more general case, there could be multiple wires 188 and multiple sources of the oscillating current. In some cases rather than or in addition to providing to the MPUs time dependent magnetic field directly, these fields can be first converted to collective magnetic oscillations and then routed through magnetic material or materials to specific locations (input channels) within specific MPUs.

Figure 33:
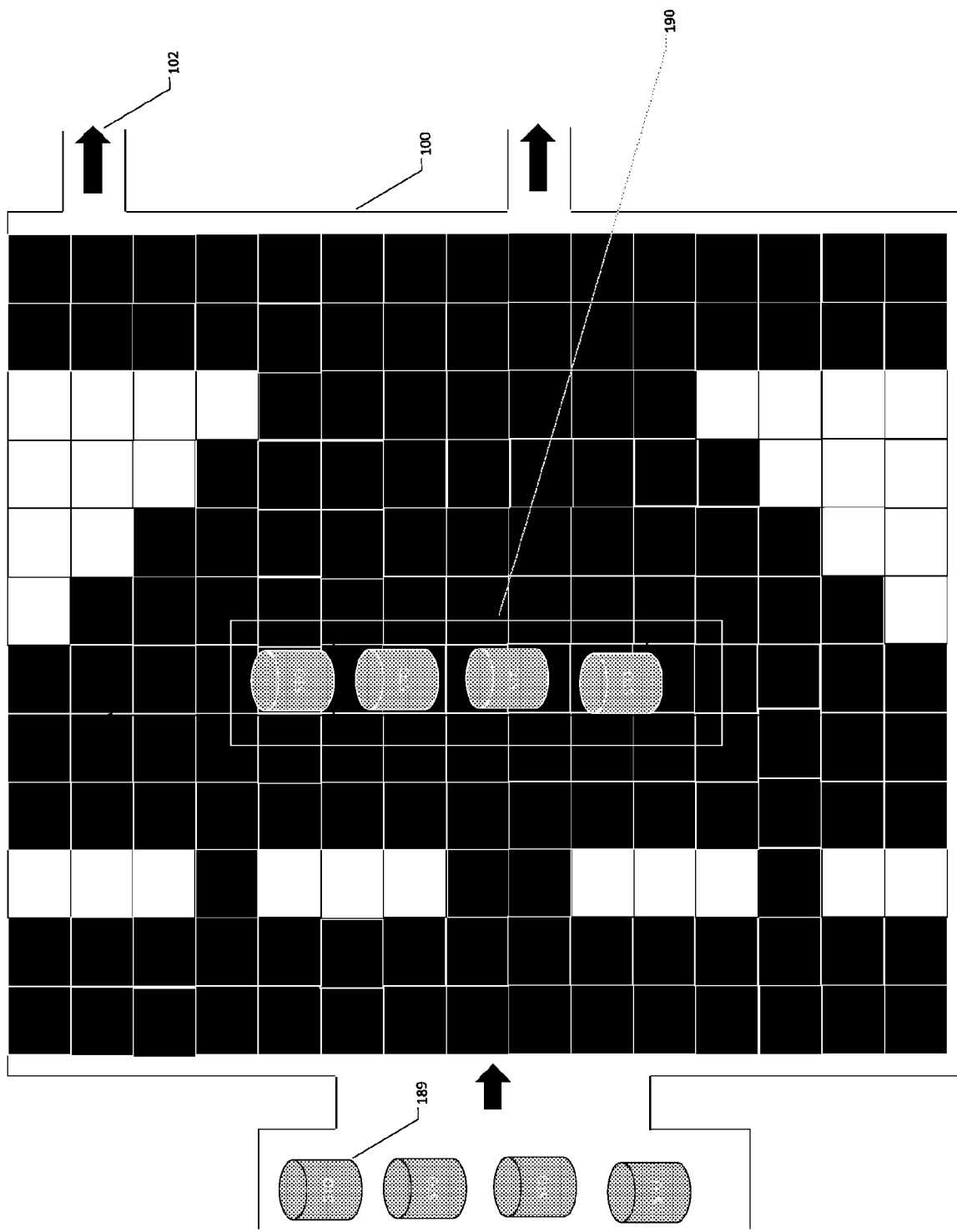

In one embodiment shown in FIG. 33, the phase coherence between the collective magnetic oscillations inside magnetic element or elements 100 and the external power source is accomplished by means of the latter containing single or multiple STOs, which are phase locked with respective to the collective magnetic oscillations within at least some portion of one or more MPUs. In one embodiment at least some of such STOs are also phase locked with respect to one another, forming an array of STOs 189. In one embodiment one or more STOs are physically integrated 190 with the magnetic element's 100. In one embodiment one or more STOs are located in external device FIG. 27 which is connected to the MPU by wires or other means. It is not required that in any such systems the entire power is provided by a single source, for example, an array of STOs.

Thus, in accordance with some disclosed examples, an MPU is provided that includes an input channel configured to receive an input signal, a magnetic element having a predetermined magnetic arrangement configured to perform a predetermined operation on the received input signal and provide a resulting output signal, and an output channel configured to receive and output the resulting output signal. The signals conducted through the input and output channels may be transformed into magnetic field oscillations by the magnetic element. The MPU may be configured to operate in accordance with different dependencies of the output versus the input signals. In some embodiments, the input signals are received as time dependent magnetic fields, as collective magnetic oscillations, and/or are converted to time dependent magnetic fields by the magnetic element. The magnetic element may include at least one layer made from one or more magnetic or non-magnetic materials. The magnetic element may a patterned array of magnetic dots that may be shaped as at least one of spherical, conical, bar-shaped, cylindrical, and/or prism.

In further examples the magnetic element includes a granular magnetic material. The magnetic element may includes a number of areas, the magnetization of which can be altered independently from one another. The magnetic element may a magnetic material with a significant crystalline magnetic anisotropy oriented predominantly along the out of plane direction.

Some implementations include a magnetic programmer configured to alter the magnetization in the magnetic element. The magnetic programmer may be configured to alter a physical property of the magnetic element to impact magnetization dynamics in the magnetic element. The magnetic programmer includes, for example a conducting wire placed in proximity to, or at least partially directly within the magnetic element, where a current flowing through the wire generates a magnetic field. A magnetic structure may be provided that is configured to be magnetized by the conducting wire and impact the amplitude and direction of the magnetic field in the magnetic element. In other examples, the magnetic programmer includes at least one of a spin torque oscillator and/or an optical radiator configured to apply optical radiation to the magnetic element. Alteration of magnetization may occur by means of spin torque based activation of some sections of magnetic material within the MPU's magnetic element.

Still further examples have a plurality of the input channels and the output channels, wherein output channels are activated based on predetermined properties of the input channels. The input signal may have a mixture of different input frequencies, where the magnetic element is configured to decompose the different input frequencies into output signals having individual single frequency components of the input frequencies. The input and/or output signals may be associated with a specific direction of propagation, which can be adjusted by altering the magnetization and/or physical properties of the magnetic element.

In some embodiments the, wherein the predetermined operation includes one or more of a logical operation, a vector-matrix multiplication, and/or an amplification of signal within the magnetic element. The input signals may be amplified at least in part by creating the magnetization pattern within the magnetic element which enables power accumulation of collective magnetic oscillations. The input and/or output signals may be comprised of single or multi-frequency oscillations, and may be comprised of "spikes", short packets of oscillations.

The predetermined operation may by the magnetization being altered by a magnetic programmer. The values of parameters associated with the input signals may be changed by means of altering the magnetization within a magnetic element, and the values of parameters associated with the input signals may be changed by means of altering the physical parameters impacting the magnetization dynamics within a magnetic element. Additional power may be supplied within the magnetic element, by means such as wire conducting the oscillating current, spin torque oscillator, input signals or other.

A system may be composed of multiple MPUs, where the output signal from one of the MPUs serves as input signal for another one of the MPUs. In such systems, where the predetermined operation may involve processing the information in multiple stages, at least some of each correspond to different physical areas within single or multiple magnetic elements contained within the MPU. The different stages may functionally separated, at least in part, by patterns of altered magnetization and/or differences in physical properties. The location of at least some of the channels forms circular, semi-circular or elliptic patterns in some examples. The overall functionality may include that of a Neural Network, with multiple layers performing at least vector-matrix multiplication over the input received from the previous layer or layers and/or external input sources, and outputting the results to the next layer or layers and/or outside recipients, possibly with saturation of at least some of the outputs. The functionality of at least some of the layers may be realized in accordance to the multi-stage operationality noted above.

Various modifications and alterations of this disclosure may become apparent to those skilled in the art without departing from the scope and spirit of this disclosure, and it should be understood that the scope of this disclosure is not to be unduly limited to the illustrative examples set forth herein.

The invention claimed is:

1. A magnetic processing unit ("MPU") comprising:
an input channel configured to receive an input signal;

a magnetic element having a predetermined magnetic arrangement configured to perform a predetermined operation on the received input signal and provide a resulting output signal;

an output channel configured to receive and output the resulting output signal.

2. The MPU of claim 1, wherein the input signals are received as time dependent magnetic fields.

3. The MPU of claim 1, wherein the input signals are received as collective magnetic oscillations.

4. The MPU of claim 1, wherein the magnetic element includes at least one layer made from one or more magnetic materials.

5. The MPU of claim 1, wherein the magnetic element includes a patterned array of magnetic dots.

6. The MPU of claim 5, wherein the magnetic dots are shaped as at least one of spherical, conical, bar-shaped, cylindrical, and/or prism.

7. The MPU of claim 1, wherein the magnetic element includes a granular magnetic material.

8. The MPU of claim 1, wherein the magnetic element includes a plurality of areas that may be altered independently from one another.

9. The MPU of claim 8, wherein the magnetic element includes a magnetic material with a significant crystalline magnetic anisotropy oriented predominantly along the out of plane direction.

10. The MPU of claim 1, further comprising magnetic programmer configured to alter magnetization in the magnetic element.

11. The MPU of claim 10, wherein the magnetic programmer is configured to alter a physical property of the magnetic element to impact magnetization dynamics in the magnetic element.

12. The MPU of claim 10, wherein the magnetic programmer includes a conducting wire that when placed in proximity to, or at least partially directly within the magnetic element, a current flowing through the wire generates a magnetic field.

13. The MPU of claim 12, further comprising a magnetic structure configured to be magnetized by the conducting wire and impact the amplitude and direction of the magnetic field in the magnetic element.

14. The MPU of claim 10 wherein the magnetic programmer includes a spin torque oscillator.

15. The MPU of claim 2, wherein the received input signals include a mixture of different input frequencies, and wherein the magnetic element is configured to decompose the different input frequencies into output signals having individual single frequency components of the input frequencies.

16. The MPU of claim 1, wherein the predetermined operation includes an amplification of signal within the magnetic element.

17. The MPU of claim 1, wherein the predetermined operation includes a vector-matrix multiplication.

18. The MPU of claim 1, wherein input and/or output signals include short packets of oscillations.

19. The MPU of claim 1, where the values of parameters associated with the input signals are changed by means of altering the magnetization within a magnetic element.

20. The MPU of claim 1 where additional power is supplied within the magnetic element, by means such as wire conducting the oscillating current, spin torque oscillator, input signals or other.

21. The MPU of claim 1, wherein the magnetic element includes a plurality of areas, and wherein the predetermined operation includes processing the received input signal in multiple stages corresponding to the plurality of areas.

22. The MPU of claim 21, wherein the magnetic element includes a plurality of magnetic elements corresponding to the plurality of areas.

23. The MPU of claim 21, where the magnetic element includes patterns of altered magnetization corresponding to the plurality of areas that physically separate the multiple stages.

24. The MPU of claim 21, where the magnetic element includes a plurality of physical properties corresponding to the plurality of areas that physically separate the multiple stages.

25. The MPU of claim 1, where the location of at least some of the channels forms circular, semi-circular or elliptic pattern.

26. The MPU of claim 4, wherein the magnetic element includes a plurality of layers, wherein an output of a first one of the layers is received by a second one of the layers.

27. The MPU of claim 26, wherein the plurality of layers are configured to implement a neural network, and wherein the second layer is configured to perform a vector-matrix multiplication over the output of the first layer.

28. The MPU of claim 27, where the first and second layers are separated by patterns of altered magnetization and/or differences in physical properties of the magnetic element.

* * * * *